(12) United States Patent  
Jacobs

(10) Patent No.: US 6,492,204 B1  
(45) Date of Patent: Dec. 10, 2002

(54) ELECTRONIC DEVICES HAVING THERMODYNAMIC ENCAPSULANT PORTIONS PREDOMINATING OVER THERMOSTATIC ENCAPSULANT PORTIONS

(75) Inventor: Richard Jacobs, Oxnard, CA (US)

(73) Assignee: JP OX Engineering, Oxnard, CA (US)

( * ) Notice: Subject to any disclaimer, the term of this patent is extended or adjusted under 35 U.S.C. 154(b) by 0 days.

(21) Appl. No.: 09/863,629

(22) Filed: May 22, 2001

Related U.S. Application Data

(63) Continuation-in-part of application No. 09/613,185, filed on Jul. 10, 2000, which is a continuation-in-part of application No. PCT/US99/01585, filed on Jan. 26, 1999.

(51) Int. Cl.$^7$ .......................... H01L 21/44; H01L 21/48; H01L 21/50
(52) U.S. Cl. ........................................ 438/127; 438/106
(58) Field of Search .................. 438/106, 107, 438/108, 109, 124, 127, 613, 615

(56) References Cited

U.S. PATENT DOCUMENTS 5,650,460 A * 7/1997 Jacobs ........................ 524/440
6,225,418 B1 * 5/2001 Satsu et al. .................. 525/524
6,423,572 B1 * 7/2002 Shiflet ........................ 438/106

* cited by examiner

Primary Examiner—David Nelms
Assistant Examiner—Phuc T. Dang
(74) Attorney, Agent, or Firm—Louis J. Bachand

(57) ABSTRACT

A method for and an electronic device circuit board having a contact and an integrated circuit chip of a given physical geometry, the chip having a lead electrically connected in hot-soldered relation to the contact, the chip having a protective composition congruent therewith and adhering thereto, the composition being a resin having thermostatic crystalline polymer chain portions and thermodynamic polymer chain portions, the thermodynamic polymer chain portions being present in such proportion that they expansively absorb the heat of the hot solder connection in preference to the thermostatic crystalline polymer chain portions. The protective composition remains congruent with and adheres to the physical geometry of the chip through a soldering cycle.

29 Claims, 1 Drawing Sheet

ELECTRONIC DEVICES HAVING THERMODYNAMIC ENCAPSULANT PORTIONS PREDOMINATING OVER THERMOSTATIC ENCAPSULANT PORTIONS

CROSS REFERENCE TO RELATED APPLICATION

This application is a continuation in part of my copending U.S. patent application Ser. No. 09/613,185, filed Jul. 10, 2000, which in turn is a continuation in part of Patent Cooperation Treaty Application No. PCT/US99/01585, filed Jan. 26, 1999.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Technical Field

This invention relates to electronic devices of the type having electrical components soldered together. The invention further relates to such devices in which one or more of the components are protected with an environmentally shielding encapsulant before soldering operations are performed. The invention thus relates to electronic devices that incorporate one or more integrated circuit chips and carrier assemblies by solder connection of their electrical leads to contacts connected or connectable to other circuitry in the device. In particular the invention relates to manufacture of such devices using heated, flowing solder to bond the electrical leads to the contacts while protecting the encapsulants typically on the assemblies from degradation from exposure to the heat of the solder.

2. Description of the Related Art

Electronic devices herein refers to the combination of integrated circuit chips (IC's) and supports therefor, including those supports commonly referred to as circuit boards. Generally electronic devices comprise a structure incorporating an IC bonded to a carrier as the support. The IC has incoming and outgoing (I/O) electrically conductive leads to electrically connect itself to the carrier as an I/C/carrier assembly. The IC can be any of a number of standard semiconductor devices, including without limitation flip-chips, ball-grid arrays, chip-on-board assemblies or tape-automated-bonded ICs. The IC can be bonded to a carrier (or lead frame) having mating incoming and outgoing electrically conductive leads. The carrier is typically composed of FR4 epoxy boards, bis-maleimide circuit boards, copper lead frames, Kovar lead frames, flexible circuitry or various ceramic substrates, such as aluminum nitride ceramics. The carrier will contain electrically conductive laminar leads typically having fine pitch. The material bonding the IC to the carrier can be organic such as any suitable thermosetting or thermoplastic polymer, some containing thermally conductive or electrically conductive fillers, or the bonding material can be inorganic and composed of a solder, solder paste, glass, some with thermally or electrically conductive ingredients contained within a glass. After assembly of the IC and carrier, the IC is electrically connected to the carrier using wire-bonding techniques utilizing gold or aluminum wire, or utilizing bumped chips soldered or bonded to a grid array. Once mechanically and electrically assembled, the IC and carrier assembly is protected from the environment by encapsulation with a suitable encapsulant for eventual use in an electronic device. In creating the electronic device, the encapsulated assembly leads are juxtaposed with device contacts connected to the device circuitry and soldered therewith to form conductive junctions by dipping or otherwise flowing solder over the juxtaposed contacts and leads. Failure of the encapsulant to survive the 20 to 120 seconds of heating in direct contact with molten solder, or indirect contact therewith by exposure to the heat of the molten solder, as manifested by degradation of the encapsulant through debonding, softening, increased tackiness or apparent gumminess exposes the electronic device to environmental problems and possible fatal contamination.

BRIEF SUMMARY OF THE INVENTION

It is an object therefore to provide an improved electronic device able to survive solder heat exposure during soldering cycles. It is another object to provide a method of manufacturing electronic devices incorporating encapsulated components in which the components are protected from environmental damage by an encapsulant resistant to soldering cycles. It is a further object to provide such devices and methods in which their component encapsulants have predominately thermodynamic polymer portions over thermostatic polymer portions so as to endure soldering temperature cycles without degradation. It is a still further object to provide to the IC assembly with a carrier a mass that contains within it a thermal well sufficient to incorporate the heat flux generated during solder heat exposure. It is yet another object to provide structure in which the thermal wells function by incorporating the heat flux by randomizing or ordering polymer chains rather than in the form of internal energy, in which there is sufficient mass capacity and in which the thermal wells function to capture the intensity of the heat flux for a period sufficient to allow the encapsulant to withstand bond-breaking and disintegration while, at the same time, reducing stresses sufficient to maintain the integrity of the entire encapsulant assembly during the solder dipping process and during cool-down to room temperature. A further object is to attach the entire encapsulated IC/carrier assembly to main circuitry to be soldered, e.g. by being passed over wave solder to create the solder contacts with the main circuitry while maintaining a heat-stable, encapsulated and hermetically-sealed integrated circuit structure, so as to form the invention electronic device.

These and other objects of the invention to become apparent hereinafter are realized in the method for the manufacture of an electronic device including putting through a hot solder cycle for electrical connection to each other a carrier contact and a lead of an integrated circuit chip having a predetermined physical geometry which is substantially constant in the presence of the hot solder, and during the course of such hot solder cycle maintaining about the chip in heating contact with the solder a protective composition congruent with and adhered to the chip, the protective composition comprising a resin subject to expansion with the heat of the solder, the resin having crystalline thermostatic polymer chain portions and thermodynamic amorphous polymer chain portions, the proportion of the thermodynamic polymer chain portions to the total of polymer chain portions being sufficient to absorb the expansion of the resin in the presence of solder heat without concurrent expansion of the thermostatic polymer chain portion so as to maintain the congruity with and adherence to the chip of the protective composition through the hot solder cycle.

The invention further provides the product of the foregoing method and more generally an electronic device comprising a carrier having a contact and an integrated circuit chip of a given physical geometry, the chip having a lead electrically connected in hot-soldered relation to the contact, the chip having a protective composition congruent therewith and adhering thereto, the composition comprising a resin having thermostatic crystalline polymer chain portions and thermodynamic amorphous polymer chain portions, the thermodynamic amorphous polymer chain portions being present in such relative proportions that the thermostatic polymer chain portions remain congruent and adherent to the chip in their locus of original application after solder heat contact.

The invention electronic device and method typically employs as the resin the polymerization reaction product of a first reactive component formed of an aliphatic diisocyanate prepolymer and an oligomer reacted with an aliphatic diisocyanate and a second reactive component formed of an aliphatic or aromatic diamine and an oligomer, the oligomer comprising a generally straight-chain polymeric moiety having a molecular weight between about 100 and 20,000 daltons and substituted on about every second to fifteenth in-chain carbon atom and effective to produce three-dimensional twisting and winding atactically, syndiotactically or isotactactically in the resin; first reactive component prepolymer aliphatic diisocyanate comprises methylene dicyclohexane diisocyanate, isophorone diisocyanate, and hexamethylene diisocyanate, the prepolymer being comprised of from 3 to 50% by weight of the diisocyanate, the prepolymer being reacted with methylene dicyclohexane diisocyanate, isophorone diisocyanate, or hexamethylene diisocyanate present in an amount from 5 to 50% by weight of the first reactive component;

The oligomer comprises active hydrogen functional polymerized linear, cyclic or branched alkanes and alkenes, and alkanes or alkenes polymerized with alkenes or alkanes respectively or alkynes, e.g. homo-and co-polymers of ethylene, propylene, butylene, vinyl, allyl, chlorinated vinyl, or diene monomers, oligomers and polymers, such as polyvinyl chloride, ethylene polymers, propylene polymers, dienes, ethylene-propylene polymers, polyisoprenes, natural rubbers, polybutylene polymers, styrenebutadiene polymers, or halogenated polymers, and preferably polymers of 1,3-butadiene as the oligomer, the polymers having a molecular weight of less than about 4000 daltons.

The second reactive component employs the oligomer comprising a generally straight-chain polymeric moiety having a molecular weight between about 100 and 20,000 daltons and substituted on about every second to fifteenth in-chain carbon atom and effective to produce three-dimensional twisting and winding atactically, syndiotactically or isotactactically in the resin; the second reactive component also employs as the amine one comprising a primary or secondary aromatic or aliphatic diamine, preferably selecting as the amine an aromatic diamine, selecting as the diamine a primary or secondary aromatic or aliphatic diamine comprising a diamino alkane, or an alkyl, alkoyl, aryl, aroyl, or alicyclic-substituted diamino alkane, or specifically selecting the amine from ethylene diamine, piperazine, n-aminoethyl piperazine, diethylene triamine, triethylene tetramine, piperazine cyclics, 1,3-bis (aminoethyl) cyclohexane, 1,4 diaminocycylohexane, m-xylene diamine, homologues thereof, and amino-capped low molecular weight polyols, preferably the diamine having a molecular weight of less than about 2000 daltons, and being present in an amount of less than about 10% by weight of the second reactive component.

The invention method and product further contemplates using an aromatic diamine, such as a primary or secondary aromatic amine having di- or multifunctionality and a molecular weight of less than about 2000 daltons, e.g. 3,5-diethyl-2,4-toluene diamine, di-(3,5-methyl thio)-2,4-toluene diamine, methylene-bis-orthochloro aniline, methylenedianiline, methylene-bis-methyl anthranilate, m-phenyl diamine, trimethylene glycol-di-p-amino benzoic ester, or amine capped polyols.

BRIEF DESCRIPTION OF THE SEVERAL VIEWS OF THE DRAWINGS

The invention will be further described in conjunction with the attached drawing in which the single FIGURE is a view in vertical section of an electronic device according to the invention.

DETAILED DESCRIPTION OF THE INVENTION

Figure 1:
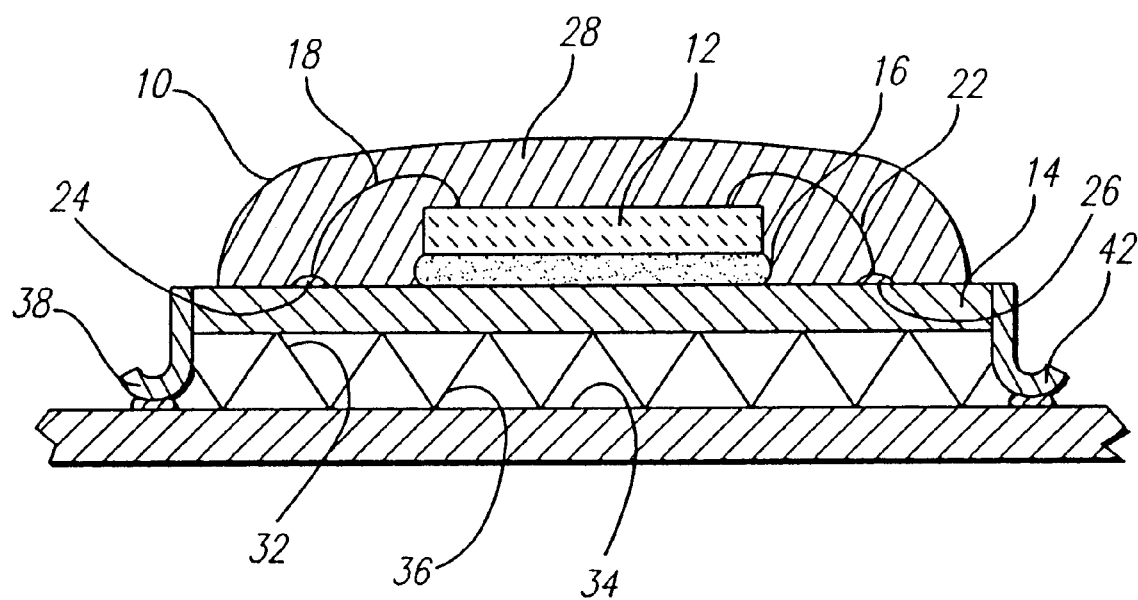

Satisfactory electronic devices according to the invention will have two properties in order to resist disabling degradation from solder heat of the encapsulant composition: First, a capacity to respond dynamically in the encapsulant to heat exposure without separating the encapsulant from the underlying, essentially dimensionally static substrate composed for example of an IC chip (This requires a sufficient thermodynamic polymer portions to so respond and sufficient thermostatic polymer portions to maintain the physical strength and adherence of the encapsulant on the substrate), and Secondly, a resistance to scission of the polymer chemical bonds under the temperature conditions and for the period of a soldering cycle. These desiderata are found in the following Example.

EXAMPLE 1

The invention will be further described with reference to the following Example in which an encapsulant resin is applied to an electronic component and evaluated for resistance to degradation from solder heat as in a soldering cycle. A two-part polymer precursor composition was prepared as follows:

Part A

Step 1:
28.00 grams of methylenedicyclohexane-4,4'-diisocyanate were placed into a vessel, followed by 62.00 grams of 2400 MW, di-functional, hydroxyl-terminated polybutadiene resin (R45HT, Elf Atochem). Both materials were mixed and heated to 310° F. (154.4° C.) for 1 hour to make a quasi-prepolymer.

Step 2:
Once the Step 1 pre-polymer reaction was completed and the prepolymer cooled to room temperature, 10.00 grams of methylenedicyclohexane-4,4'-diisocyanate (Desmodur W, Mobay Chemical), and 1.00 grams of A187 silane (Union Carbide) were added. The mixture was blended thoroughly and then degassed at 5 mm Hg reduced pressure for approximately 15 minutes until bubbles disappeared. The resulting polymer Part A was packaged in one side of a 50 cc dual cartridge.

Part B

Step 1:
77.78 grams of 2800 MW, di-functional, hydroxyl-terminated polybutadiene resin (R45HT, Elf Atochem, North America) were weighed into a cup, followed by 15.0 grams of diethyltoluene diamine (Ethacure 100, Ethyl Corporation), 1.00 grams of Raven 430 Carbon (Colombian Chemical), 0.200 grams of Fluorad FC430 (3M Company) and 0.125 grams of Coscat 83 (Cosan Chemical). The mixture was mixed and heated at 212° F. (100° C.) for 15 minutes to de-water the system, degassed at 5 mm Hg reduced pressure until bubbles disappeared and then packaged into the other side of the 50 cc dual cartridge.

Composition Analysis For Thermodynamic Predominance

The foregoing reagents will provide the resulting urethane polymer with sufficient amorphous/rubbery phase portions in the overall composition based on the equation of thermoelasticity. The composition reagents have differential reactivity where nearly exactly equal chemical equivalents of methylenedicyclohexane-4,4'-diisocyanate react entirely with the total chemical equivalents of diethyltoluene diamine (Ethacure 100, Ethyl Corporation) in the overall composition. In the process, large domains of crystalline/glassy hard segments forming the thermostatic portions have time to form before the amorphous butadiene oligomers and remaining methylenedicyclohexane-4,4'-diisocyanate prepolymer within the amorphous liquid matrix have a chance to react. Then the butadiene oligomers and remaining methylenedicyclohexane-4,4'-diisocyanate prepolymer tie these amorphous segments into the crystalline/glassy hard segments.

Note the following proportions:

|  | EW | Equivalents | Weight |
| --- | --- | --- | --- |
| Hard Segment Material |  |  |  |
| diethyl toluene diamine | 89 | 0.169 | 15.0 g |
| methylene-dicyclohexane-4,4'-diisocyanate | 131 | 0.169 | 22.1 g |
| A187 silane |  |  | 1.0 g |
| Raven 430 Carbon |  |  | 1.0 g |
| Fluorad FC430 |  |  | 0.2 g |
| Total crystalline/glassy phase |  |  | 39.3 g |
| Amorphous Segment Material |  |  |  |
| methylene-dicyclohexane-4,4'-diisocyanate (38.0 g − 22.1 g = 15.9 g) | 131 | 0.169 | 15.9 g |
| Hydroxyl-terminated polybutadiene resin, R45HT (62.0 g + 83.0 g = 145 g) | 1176 | 0.123 | 145.0 g |
| Coscat 83 |  |  | 0.1 g |
| Total amorphous phase |  |  | 161.0 g |
| Total composition |  |  | 200.3 g |

As will be evident, the total amorphous phase is (161.0 g/ 200.3 g) 100=80.3 percent. This is in excess of the thermodynamic portions expected as apparently necessary for the thermoelasticity of this composition to relieve all internal stresses of the composition for a temperature excursion to solder dip temperature of 232° C. (450° F.). The experimental behavior of this composition, detailed below, is predicted by the equation of thermoelasticity set forth hereinafter.

Mixing

Parts A and B were dispensed pneumatically side-by-side through a static mixer tip (nozzle) and onto three types of substrates: polyethylene, 0.64 mil alumina and 0.06 mm FR4 board. The FR4 and Alumina samples were first prepared by heating the substrate to approximately 40° C., and then, using an xy table dispenser, dispensing the materials at 60 degrees centigrade onto each substrate. The electronic program used to create the 28 mm by 53 mm rectangle samples was run at a speed of 4 mm/sec. It was immediately observed that the flow of the mixture was excellent and that low crown heights of about 28 mils were achieved.

After full resin cure for an additional 1 hours at 100° C., the samples were subjected to four hours of pressure cooking which was used an expedient version of approximating performance at the highest level of exposure according to JEDEC (See below). The samples were subsequently kept for 7 days at 85° C. with 85% relative humidity. This preconditioning meets the highest level of JEDEC Test Method A112, Level 1.

Several tests were performed on the pressure treated and JEDEC Level 1 treated samples: Solder Pot Test (220 to 230° C.), IR reflow (at 3.5 degrees/sec rise from 25° C. to 228° C., then 3.5 degrees/sec fall back to 25° C.) and thermal mechanical analysis (TMA). Both the alumina and FR4 samples passed the Solder Pot Tests with no visible degradation or delamination from either substrate after 20 seconds of exposure. Both the alumina and FR4 samples passed the Solder Reflow Test with no visible signs of degradation or delamination.

The example material deposited globs thus will successfully withstand the highest level (level 1) of JEDEC Test Method, A112 for large 28 mm×53 mm samples.

The example polymer also meets the two criteria of lack of degradation under solder heat and absence of scissioning. An analysis of the resin constituents explains the results. In terms of proportion of thermodynamic versus thermostatic portions in the resin, the example resin contains approximately 80% amorphous and thermodynamic portions and correlatively 20% of crystalline and thermostatic portions. These portions are knit together and function to allow the heat of the proximate or contacting solder to expand the thermodynamic portions which shift without weakening the resin or causing the nondynamic or thermostatic crystalline portions to expand, or shift, or to lose their adherence to the carrier which of course expands not at all or barely. The stresses then inherent in the adhesion of an expandable resin adhered to a nonexpandable carrier are thus relieved by absorbing the stress in the thermodynamic portions of the resin encapsulant and not in the thermostatic portions. Of course only if there is sufficient of the thermodynamic portions can this result be obtained. While that specific proportion will vary with the resins involved, the example resin has approximately 80% thermodynamic portions and thus about 20% thermostatic portions. With the example type of resin, a sufficient amount of thermodynamic portions (sometimes called thermal wells herein) theoretically would be less than 80%. Other resins may be as low as 50% thermodynamic portions, particularly for less stringent applications.

While not wishing to be bound to any particular theory as an explanation of these results, it is believed that the example resin has the proportion of thermodynamic resin portions to provide sufficient thermal wells to enable sufficient internal relief of stresses when utilized as an encapsulant, and from its crystalline or thermostatic portions and its chemical constitution sufficient resistance to bond breaking for a period exceeding 20 seconds in the solder pot to be a successful encapsulant resin. These samples showed no degradation, that is no softening, no increased tackiness or gumminess. The successful test indicates that the resin bonds have not been broken and the polymer chains have not been scissioned, thereby meeting the requirement of an absence of heat degradation and resistance to bond breaking. The achieved crown height of 28 mils meets the requirements for all commercial applications with the possible exception of smart cards. Moreover, the working time was sufficiently long for automatic application where the time interval between successive globbing applications is a few seconds. The minimum proportion, or percent, of amorphous, rubbery or thermodynamic phase or portions in the foregoing resin can be calculated taking into account the temperature coefficient of force, densities, coefficients of expansion, elastic modulus and heat capacities of pure crystalline and amorphous phases by the urethanes as set forth in detail below. These values can be approximated as follows:

Where $\rho$=0.9 gram/cc for the mixed crystalline and amorphous phases

Cp=0.114 cal/gm° C. for the above urethane resin;

Cv=0.10 based on an estimate of the ratio of the masses of the crystalline to rubbery phases. Here, we estimate that Cp and Cv pertain to the crystalline phases.

$E_c \approx$5000/.10 (lb/in$^2$) (The elastic modulus of the crystalline segments, keeping mind that the strain units are unitless)

Note: This is an estimate based on similar pure crystalline systems.

$B_c \approx$16,666 (lb/in$^2$), where $B_c$ which is the bulk modulus $\alpha$=100 ppm/° C. for the overall composition. We estimate that $\alpha_r$=150 ppm/° C. for the rubbery phase $\alpha_c$=50 ppm/° C. for the crystalline phase $T_1$=232° C.; $T_0$=20° C.; $\Delta T$=212° C.

C=94.14 pounds per cal/cm

The area (A) of the encapsulant is given as 1.30 square centimeters.

The force of conformance is estimated to be approximately 26 grams.

The formula for determining the necessary volumetric ratio of amorphous thermodynamic phases to crystalline phases is $$\frac{V_r}{V_c} = \frac{B_c \cdot A \cdot \alpha_c^2 \cdot (\Delta T)^2}{f - [94.1 \cdot \rho \cdot A \cdot (Cp - Cv)/\alpha_r]}$$

Different Types of IC/Carrier Protection

Integrated circuits have historically been encapsulated with various materials in order to provide mechanical protection and a hermetic seal. The reasons for mechanical protection are obvious. The reason for providing a hermetic seal is to reduce or eliminate the ingress of moisture and salts that may be carried to the sensitive ICs and wire connections. Even trace amounts of electrically conductive ions will destroy the circuitry. In general, extremely clean resinous or polymer materials (containing cations and anions at a level of approximately 2 parts per million by weight or less) such as epoxies, acrylates and silicones have been commercially used to achieve the necessary mechanical protection and hermetic seal.

The sealing of the integrated circuit is illustrated in the drawing. In the Figure integrated circuit assembly 10 comprises a semiconductor device component 12 bonded to a substrate 14 with adhesive 16. The device component 12 has leads 18, 22 electrically connected to contact pads 24, 26, respectively. The assembly 10 is encapsulated with an encapsulating resin 28 which is bonded to the silicon semiconductor device component 12 including at the corners thereof where stress is likely to be great if the encapsulant is heat expanded, bonded onto the electrical leads 18, 22 (and the support legs if any extending from the device component, not shown), and the substrate 14 which is likely a different material with different expansion characteristics than either the device component, the leads and of course the encapsulating resin 28. The assembly 10 has an array 32 of electrical conductors thereon which are registered with a like array 34 on the carrier 36 and soldered together by wave solder or other means, the assembly being attached to the carrier by legs 38, 42. In the course of getting solder to the interface of the contact arrays 32, 34, the assembly 10 is necessarily exposed to the heat of the molten solder if not the solder itself for a matter of some seconds, e.g. 20 to 120 seconds, depending on the type of soldering being carried out. If the encapsulating resin 28 is heat destructible, that is thermally unstable at solder temperatures, the protection for the device component 12 will fail. A sufficiently heat resistant encapsulating resin 28 may nonetheless be problematical if it expands in a manner that destroys the leads 18, 22 or their connection, or distorts the assembly 10, as hereinafter explained.

The process of creating a hermetic seal is necessary for preserving the life of the electronics. However, the slight mismatches in the coefficient of linear expansion (CTE) of the commercially available encapsulants and the IC chip assembly limits the size of the encapsulant before substantial warping or delamination occurs in the gang assembly.

Resin purity and coordination of CTE are only two of the criteria that need to be met for a successful electronic device with encapsulated components. The need to solder the component leads to contact points of the device requires that tolerance of the encapsulant and the component for the rigors of automated soldering systems such as wave soldering be an important consideration in selection of materials. With respect to the encapsulant resin part of the IC/carrier assembly the cured encapsulant structure as adhered to the IC/carrier should not degrade, become thermoplastic or revert to its constituents upon exposure to soldering processes. Further, the encapsulant resin should not harbor substantial amounts of moisture or other solvents which will boil, outgas or expand upon exposure to soldering processes. Further, the encapsulant resin should have a structure that provides rapid egress for any small amount of water that might reside within the encapsulant upon exposure to soldering processes.

Matching CTE Values Using Predominately Thermostatic Resins

The matching of CTE values for the resin encapsulant, the IC, the wires present and the carrier or substrate is not necessary and is in fact counterproductive in designing electronic devices. The historical approach to the selection of encapsulating materials has been mainly to utilize crystalline or glassy epoxy or acrylate structures which substantially obey the Hookean (Hooke's Law) principles of expansion when incorporating a heat flux, that is the input heat energy takes the atoms out of their rather minimized energy states and places them in some higher energy state, thereby increasing the inter atomic distances. Under the matching CTE approach a cured encapsulant will have a structure which will match, as closely as possible, the CTE of the substrate, thus to minimize the strain between the IC, substrate or imbedded wires on the one hand and the encapsulant on the other.

Epoxies and acrylate encapsulants are typically modified in order to achieve a matched CTE with both the IC and carrier substrate. Various parts of the assembly, however, inevitably will have slightly different CTEs, so a compromise must be reached to find the best match of the encapsulants CTE with the average CTE of the assembly. Thus, a perfect match of the individual components including the encapsulant resin is not achieved.

Even for nearly perfectly matched CTEs, the extreme temperature excursion from room temperature to flowable solder temperatures imparts a strain on critical portions of the IC structure. For example, a strain can be placed on the bondline between the IC and the substrate possibly resulting in a debonded condition as the assembly is subjected to the wave solder. Or delicate wire bonds or other circuitry will be strained during the temperature excursion. More importantly, internal stresses, rather than internal strains, create debonding or breaking of wire connections. So the close matching of the CTEs is not always a sufficient strategy to prevent damage upon soldering.

Further, the CTEs of silicon ICs, the substrates upon which they are attached, and the gold or aluminum wire interconnects are all very small by comparison to the CTE of any natural epoxy, acrylic or silicone material. For example the carrier or substrate can have CTEs ranging from to 2 ppm/° C. to 20 ppm/° C. On the other hand, unfilled epoxies and acrylates have CTE ranging from 80 ppm/° C. to 150 ppm/° C. Silicone rubbers have even a considerably higher natural CTE. Therefore, these epoxy or acrylate compositions typically need to be modified by the admixing of low CTE (2 ppm/° C. to 10 ppm/° C.) mineral fillers to achieve even a close match of the encapsulant composition to the IC/substrate assembly. For modified epoxies and acrylates, the mismatch of the CTE or the strain can be minimized to within a few ppm/° C. Yet the differential stresses between the IC/encapsulant, or substrate/encapsulant and wires/encapsulant can be very large. This is because the moduli of the modified epoxy and acrylate resins are themselves typically very large. The differential stresses between the IC, substrate, or wires and encapsulant are nearly approximated by the product of the CTE mismatch times the modulus of the encapsulant for a rigid, nonelastomeric material. A situation of diminishing returns occurs when attempting to formulate for matching the low CTE of the IC, substrates and wires because the admixing of fillers to reduce the CTEs of these encapsulant resins also has the unintended side-effect of increasing their moduli to even higher levels. This can be visualized by the mineral filler particles residing, on the macroscale down to the nanoscale, between the void areas between the polymer chains. The effect is to reduce the ability of the polymer chains to expand, contract or conform in order to relieve localized stresses when necessary.

Not all IC assemblies are substantially affected by the mismatched CTE problem. The problem of internal stressing can be minimized for small component assemblies up to 100 by 100 mils square. Larger IC assemblies, however, up to 1000 by 1000 mils square have a limited ability survive differential stresses during soldering.

Mismatching CLE Values Using Predominately Thermodynamic Resins

Because of the inherent difficulty of matching the CTEs of the encapsulant and IC/substrate/wire assemblies, the present invention selects an elastomeric material, which has low modulus. Selecting an elastomer for its low modulus has the natural consequence that the CLE will be very high, on the order of 200 to 300 ppm/° C. Even though the strains at the encapsulant/IC, encapsulant/substrate or the encapsulant/wire interfaces might be large, the stresses in these areas can be minimized by using elastomer having a low modulus. Selecting this approach has another, albeit less obvious, benefit in that localized strains can be relieved when the non-contact (air-cured) surface area is maximized as part of the geometric design.

Silicone rubber is the major elastomeric material to have been considered as an encapsulant. Silicone rubber has the ability to relieve localized stresses in the high stress areas of ICs, such as at the corners of the chips or along the connecting wires. Silicone rubbers are, however, problematic in that silicones are sufficiently polar that they absorb water and salts both of which are antithetical to effective encapsulated electronic devices.

Additional criteria for an electronic device encapsulant include processability. The encapsulant must be a flowable liquid to properly coat the IC/substrate/wire assembly for mechanical protection and hermeticity. After flowing into place, it must subsequently cure. The encapsulation of ICs is usually accomplished in a production line mode where the IC is placed on a carrier and registered under the dispensing station. A small amount of encapsulant is dispensed either in a single glob, or by arranging a stream into a ribbon pattern or by arranging a grid of dots in a square or cross pattern. The pattern can be generated by adjusting the dispensed amount for each dot or stream with a programmed dispense rate timed to the shift of a multi-axis table underneath the station or by shifting the dispensing nozzle with respect to the registered station.

A major aspect of providing a quality encapsulation of the IC has to do with the flow properties of encapsulant. Three conditions are required of the flow:

1. The flow of the dispensate must be sufficiently controllable in order to generate a square or rectangular shape approximating the dimensions of the IC;
2. The dispensate must have sufficient flow so the glob, stream or dots meld together without entrapment or striations; and,
3. The flow of the dispensate must be sufficiently leveling so that the encapsulated pattern has a level surface (i.e., has a minimum radius to its crown).

Once the encapsulant is dispensed over the IC assembly, it must be cured. The encapsulant can be immediately cured or it can be immediately gelled to prevent dislocation as the assembly is move to the next production station. Cure can be by a thermosetting process involving a one-part resin containing a latent hardener which is thermally cured or light-cured, or a two-part resin/hardener system which is chemically reacted and thermally cured.

Once the IC assembly is encapsulated and fully-cured, the assembly and its carrier is tested and then stored for periods up to year before the carrier is affixed to larger circuitry and soldered. Much of the production of electronics instruments is in Southeast Asia where ambient humidities are high. High humidity can limit the quality and lifetime of electronics using encapsulated IC/assemblies. If considerable amounts of moisture are absorbed and retained in the encapsulant and IC during storage, the moisture can be boiled during the solder process. Even traces of entrapped moisture can create havoc within the IC/assembly when moisture turns into superheated steam. A condition called "pop-corning" can occur where the encapsulant cracks in areas where trace amounts of water have nucleated and formed steam. The stresses can carry down into the IC structure where debonding can occur between the IC and substrate, and wire bonds can be stressed and even broken.

Even though these cited examples of extreme stresses might not result from the soldering process, any break in the hermetic seal can create a reduced product life. So it is advisable that any selected encapsulant be tested using preconditioning to humidity and then be subjected to the conditions of soldering. An industrial standard established by IPC SM 786A, paragraph 4.152, establishes various levels of preconditioning and test standards for evaluating encapsulated IC structures. Level 1, the most severe, represents an unlimited storage life at approximately 85% relative humidity.

With these criteria in mind, the invention provides an electronic device having an IC assembly encapsulated with an elastomer meeting all of the criteria, specifically a resin having repeating urethane units which are polymerized in a manner such that there is a substantial predominance of thermodynamic portions, i.e. the amorphous portions, over the thermostatic or crystalline portions, the bodies of these portions being knit together such that the former can absorb heat input without straining the bonds between the encapsulant and substrates, the latter provides necessary strength, and the whole resists failure from soldering heat exposure and maintains its integrity during the above-noted process.

The Ideal Elastomer

The invention approach involves the determination of the ideal elastomer and the approximation of that elastomer with actual materials because an ideal elastomer is a good basis for selecting an encapsulant to be used with IC/assemblies for surviving soldering processes. An ideal elastomer is herein defined as an elastomer which has sufficiently high modulus to provide mechanical protection to the IC/assembly, and has considerable entropic character. The entropic character is related to the internal structure of the encapsulant which is imparted with as much entropic character is possible, taking into consideration that the mass needs to maintain some minimum mechanical protection by incorporating or dispersing a certain minimum level of crystalline and/or glass phases within the morphology.

In the invention there is a defined mass of level of entropic thermal wells required for any particular composition necessary to provide total internal stress relief for a particular temperature excursion. This composition is apparently independent of geometry according to the equation of thermoplasticity below.

Crystalline or glassy structures obey the Hookean principles of expansion when incorporating a heat flux based on that heat energy taking those atoms out of their rather minimized energy states and placing them in some higher energy state thereby increasing the inter-atomic distances.

Geometry Associated with Encapsulation of ICs

IC encapsulants are partially constrained by having been cast on top of substrates and around IC structures. Heating encapsulants in this geometry can still allow expansion towards the unconstrained dome top of their architectures. If there were no elastomeric domains or no interspersed crystalline/elastomeric morphological structure, expansion would normally proceed in an extreme manner towards the dome top. Given the interspersed crystalline/elastomeric structure of our polyurea/polyurethane polymers, the geometry of the mass of polymer is kept intact with minimal expansion while the elastomeric domains are constrained in response to expanding crystalline domains.

Tailoring Elastomers to Relieve Internal Stresses

Internal stresses can be relieved by juxtaposing and interconnecting two distinct types of compositions: 1) By providing crystalline structure composed of considerable conjugated structure; 2) By providing separate and distinct elastomeric phases which have molecular chains of linear structure, crystalline sites can provide structure and act to join elastomeric structure together and to maintain the cast configuration of the initial encapsulation vis-a-vis the intricate geometry of the IC and wire leads. Most importantly, elastomeric structure can absorb work done by the expanding crystalline and spherulite domains, which are interspersed amongst the elastomeric phases.

Thermal Wells

Polyureas or polyurea/polyurethane polymers of the invention are particularly characterized by their elastomeric phases. Upon being mechanically stretched or compressed, the molecular chains of the elastomeric domains can become ordered, even without imparting heat from an external source. Upon letting off the external mechanical force, the molecular chains make a spontaneous change towards randomized conformations. This response is due, not to the breaking of barriers to joint forces, but just due to the natural driving force associated with randomization of the molecular chains. This mechanism is well known and is associated with all elastomers. Our concept of thermal wells extends beyond this basic understanding of elastomers. Herein, we ascribe a distinctly different mechanism than the response to mechanical deformation above.

Internal-stress-relief can occur intermittently, alternatingly and sequentially through both the processes of randomization or ordering. Thermal wells are associated with a first ordering step: The crystalline domains are essentially fixed within the matrix, having been bonded to the substrate and IC. Heat expands these crystalline domains. The surrounded elastomeric domains become constricted by the expanding crystalline domains as the encapsulant starts its heating process. The molecular chain conformations become increasingly constrained within the entire framework. This process is associated with the natural ability of the randomly configured molecular chains of any elastomeric matrix to respond and become ordered, when necessary. A major aspect of this process is that the molecular chains in the elastomeric domains have spaces or holes between them. These holes can become occupied as the chains are constricted and forces to new places to reside.

The concept of thermal wells is also applied to second step in the sequential process: The molecular chains, having become ordered by the first process, start randomizing with further heating and provide relief of stresses on ICs and wire bonds. The process of heating, itself, becomes so intense that the barriers to rotation are finally broken at various carbon atoms. The natural driving force for randomization is derived from the breaking the joint force barriers of carbon atoms in the elastomer domains. This increases the probability that carbon bonds will overcome certain barriers to rotation and many new conformations can be achieved. Given the multitude of carbon centers in these molecular chains, this becomes a powerful mechanism for achieving new structures, and for relieving the constraining forces that were created during the first step of the process.

These two steps of the process provide the entire mechanism for a natural return of the structure to its original configuration after cooling. This is extremely important, for without return to the original configuration, ICs and wire bonds could be broken upon cooling. The second process is first reversed upon cooling. Ordering sets back in and a true mechanical response to the intermediate condition is achieved with reassertion of joint forces. This occurs only because the barriers to the joint forces at each carbon center are re-established after the crystalline domains have shrunk to the intermediate volumes. Then a second process sets in where the ordered chains are allowed to randomize again as the crystalline domains are allowed to return to their initial volumes at room temperature. Success of the encapsulant structure to resist destroying circuitry upon exposure to solder and in repeated in-use cycles is extremely dependent upon this entire return mechanism.

The indicated mechanism occurs predominately in this sequence of processes, but other process sequences can conceivably occur, depending upon the particular activation energies associated with restrictions of carbon bond rotations.

Thermal wells can be associated with a third stabilizing aspect arising in the crystalline domains. Imparting conjugated structure in these domains absorbs a certain amount of heat energy before bonds are finally broken. Conjugated structure provides stability over and above non-conjugated structure because energy can be absorbed by this type of structure in the form of resonance. Resonance processes can absorb extra heat extending the residence time of the encapsulant structure before bonds are broken.

More specifically this is what it is believed occurs in the invention glob-top encapsulants that are dispensed over and around ICs, without being bound to any particular theory: Cure is achieved at elevated temperature. During cure, the encapsulant naturally shrinks around the IC structure. Some residual internal forces remain in the encapsulant, and these forces can be in the partial ordering the molecular chains of the elastomeric domains in tension, compression, and shear, along with asserting mechanical moments. Given these initial conditions, we will consider what happens inside of the encapsulant as it undergoes the thermal excursion from room temperature to solder temperature and then back to room temperature. Most importantly, our considerations will inter-relate heat, work and energy and will avoid attempting to ascribe any direction to the relief of tension, compression and shear forces. The internal-stress-relief process is viewed in terms of energy mitigation—the ability of our systems to naturally come to equilibrium and to achieve some lowest potential energy.

Internal Stress-Relief Process 1:

The processes will be described again, now imparting more specifics with respect to the thermodynamics. The encapsulant may be considered to be at state ($S_0$) when it is at room temperature after it has fully cured. At state ($S_0$) the general stresses reside primarily in the elastomeric phases, which are residing-between and connected-to the crystalline phases. This state ($S_0$) will be slightly ordered, and will have mainly random, 1-dimensional structure. This relatively-ordered condition indicates that this is a modest-energy state for this elastomer at state ($S_0$).

The first process of the thermal excursion is where the crystalline phases start exerting forces on the rubbery phases. They can be in tension, compression, shear or have moments. During this portion of the thermal excursion, the rubbery strands of the polymer become more compressed and more stressed as the polymer heats up. Nature cannot take the easiest course in this transition, and an overall higher energy state is achieved. A non-equilibrium condition is associated with ordering of the chains at state ($S_1$). We can use the entropic term of the Gibbs Equation to describe this process: The factor $[T(S_1-S_0)]$ requires that $S_1$ be less than $S_0$. Therefore, the entire change $[T(S_1-S_0)]$ is negative. This is an ordering process. However, this ordering process occurs within the framework that new states are achievable at higher temperatures. Ordering occurs while joint forces are still being overcome by heating. A new population of ordered structures is formed. These new populations of structures exist in all 3-dimensions. The ordered structures provide conformance in response to the forces created by expanding crystallites or spherulites. An overall stress-relief is provided to the wire bonds, fine wires and the IC structure.

During the second process of the thermal excursion, the encapsulant is brought to a fully heated state ($S_2$). During this heating step, the rubbery strands of the polymer become less stretched or less stressed as the polymer heats up. Given a slow enough temperature rise, nature takes the easiest course in doing so and substantially reaches an equilibrium state. Given this extremely rapid heat-up during soldering processes, fully equilibrated states are likely not being achieved along the temperature excursion path. However, the success of the encapsulant to withstand breaking wire bonds and circuitry suggests that equilibrium be nearly achieved under these extreme dynamics. The work input of the crystallites and spherulites, which are continuing to expand and do work on the elastomeric chains, is mitigated by the randomization of these chains. This energy-mitigation process occurs because the molecular chains of the elastomeric phases stretch, compress, conform or do whatever they must do to minimize the energy of the system. We can use the entropic term of the Gibbs Equation to describe the driving force for internal-stress-relief. The change $[T(S_2-S_1)]$ requires that $S_2$ be greater than $S_1$. Again, this is a natural thermodynamic response—that of randomizing. Randomization occurs because the cumulative carbon-carbon polymer centers have the probability of finding new structures, the joint forces having been overcome by heating. This provides entirely new populations of structures. These new populations of structures arise in all 3-dimensions, but predominately in the one or two transverse dimensions providing all the necessary conformations for the molecules of the elastomeric portions to fill holes. In this context, holes are portions of the elastomeric structures that provide room for conformance. Glassy sub-structures, which are a part of the crystalline domains, have holes, which provide the opportunity for atoms and molecules to flow inwards. The newly randomized molecular chains can tuck themselves into these holes. Holes allow room for conformance of the molecular chains and provide internal-stress-relief from the expanding crystallites and spherulites.

Finally, the mixed crystalline/elastomeric polymer cools from state (S2) and returns to state ($S_0$). This sequence of thermodynamic steps describes one ideal process for energy minimization and minimal internal stress conditions for the encapsulant undergoing the temperature excursion.

Internal Stress-Relief Process 2:

There is another sequence alternative to Process 1: The encapsulant may be considered to be at state ($S_0$) when it is at room temperature after it has fully cured.

During the first step of the thermal excursion, the encapsulant is brought to semi-heated state ($S_1$). During this heating step, the rubbery strands of the polymer become less stretched or less stressed as the polymer heats up. Nature takes the easiest course in doing so and substantially reaches an equilibrium state, which is also the state of lowest energy for that heated condition. Equilibrium is associated with randomized chains at state ($S_1$). We can use the entropic term of the Gibbs Equation to describe the driving force for relief. The change $[T (S_1-S_0)]$ requires that $S_1$ be greater than $S_0$. This is a natural thermodynamic response—that of randomizing. Randomization occurs because the cumulative carbon-carbon polymer centers have joint forces, which are overcome by heating. This provides a new population of structures. These new populations of structures exist in all 3-dimensions.

During the second step of the thermal excursion, the polymer encapsulant continues to be heated as it makes a transition from semi-heated state ($S_1$) to the highest-temperature state of the excursion, state (S2). During this portion of the thermal excursion, the crystalline phases start exerting forces on the rubbery phases. They can be in tension, compression, shear or have moments. If the polymer were entirely composed of crystalline material, it would have no ability to conform to the overall stresses created by the crystalline (Hookean) phases. (An entirely crystalline-like polymer would have an overall volumetric expansion, tugging wire bonds and the silicon IC as it expands.) In our compositions, however, elastomeric phases are interspersed between the crystalline phases, and they can respond to the expanding crystallites or spherulites by conforming. During this second step of the thermal excursion, the rubbery strands of the polymer become more compressed and more stressed as the entire polymer composition heats up. The crystallites and spherulites of the crystalline phases expand and do work on the interconnecting elastomeric chains. Nature cannot take the easiest course in this transition, and an overall higher energy state is achieved. A non-equilibrium condition is associated with ordering of the chains at state ($S_2$). We can use the entropic term of the Gibbs Equation to describe this step of the process: The factor $[T(S_2-S_1)]$ requires that $S_2$ be less than $S_1$. Therefore, the entire change for this step of the process $[T(S_2-S_1)]$ is negative. However, the ordering process occurs within the framework that new states are achievable with each incremental increase in temperature. Ordering occurs while joint forces are still overcome by heating. A new population of ordered structures arises. These new populations of structures exist in all 3-dimensions and provide stress-relief to the forces created by expanding crystallites or spherulites.

Finally, the mixed crystalline/elastomeric polymer cools from state (S2) and returns to state ($S_0$). This sequence of thermodynamic steps describes another idealized process for energy minimization and minimal internal stress conditions for the encapsulant undergoing the temperature excursion. Our inventions relate to the mixed crystalline/elastomeric phases, which allow this process to occur.

The Mathematical Basis for Internal-Stress-Relief

We will consider the cumulative models above for the encapsulant. In reality, our encapsulants are materials having polymer chains under tension starting at state ($S_0$) at room temperature. However, for mathematical simplicity, we will start by considering a model that has no external forces applied. We consider the model to have an infinitesimal cylindrical-shaped section $V_c$ having a cross-sectional area A and length $L_c$. This cylinder contains strictly crystalline or glassy materials obeying or nearly obeying Hookean elastic principles. Attached at one end of area A is a second cylinder $V_r$ having the same cross-sectional area A and some other length $L_r$. This cylinder contains strictly elastomeric materials obeying strictly entropic laws. The second cylinder $V_r$ is related to the first cylinder $V_c$ and where the total volume is describe by $V_t$:

$$V_t=V_c+V_r.$$

We can simplify the mathematics of the problem by allowing the thermal well $V_r$ to act at the molecular level contiguously and incrementally within cylinder $V_t$. Therefore, in this new system, we have only one cylinder of total volume $V_t$ having initial volume $V_c$ associated with the crystalline morphology and volume $V_r$ associated with elastomeric morphology.

The encapsulant structure is attached to some IC assembly including a chip and substrate at wall of area A at some reference temperature $T_0$. We will consider that any internal stresses due to mismatches of expansion and contraction between the substrate, IC and adhesive laminate structure or encapsulants are minimized and inconsequential at the reference temperature $T_0$ of 25° C. Within this cylinder, we need to consider the energy that is minimized in the system and the associated minimal internal stress conditions created on the adhesive laminate structure or encapsulants of general Volume $V_t$.

Work Associated with Heating of the Crystalline Phases

A heat flux penetrates crystalline volume $V_c$ creating an expansion in the crystalline volume $V_c$ of some length x·dL. The volume $V_c$ becomes stressed by the heat change with a length change of magnitude (1+x)·dL. The volume $V_r$ conforms to an internal conforming force associated with volume change $V_c$ and counteracts with a length change of magnitude (1−x)·dL. Overall, there is some change in length dL due to the combination of expansive mechanical forces and entropic conforming forces. As long as A is constant with a temperature change, then $$dV=A \cdot dL, \quad V_c=A \cdot \Delta L, \text{ and}$$

$$L_t=L_c+L_r.$$

Within this cylinder, we need to consider the work done by the expanding volume $V_c$ across unit area A where:

$$dW=\text{Force} \cdot dV_c/A=\text{Force} \cdot dL.$$

Since this is a mechanical force associated with strain, we can consider that the force exerted across plane A is the same that occurs upon extension of the material mass:

$$dW=(F/A) \cdot A \cdot dL$$

where F/A is another expression for stress which we can otherwise measure under different conditions related to strain. The relationship of stress to strain is the elastic modulus $E_c$ for the crystalline phase expressed by the relationship:

$$F/A=E_c \cdot dL$$

So, $$dW=(E_c \cdot dL) \cdot A \cdot dL = E_c \cdot A \cdot dL^2$$

We can otherwise express the differential strain dL of the crystalline phases by their measurable parameters of initial thickness ($L_0$), CTE and temperature change:

$$dL=L_0 \cdot \alpha_c \cdot dT$$

$\alpha_c$ is the differential linear coefficient of expansion between the substrate/IC assembly and the adhesive laminate structure or encapsulants. The term dT is the differential change in temperature. As we have set up the model, the square of the crystalline phase coefficients of expansion lies in a plane contacting the substrate. It appears that the thermoelasticity equation is also telling us that the conformance in the x-axis allows for conformance on any yz-plane contacting the IC/assembly. Therefore, $$dW=E_c \cdot A \cdot (L_0 \alpha_c dT)^2$$

The equation rearranged, $$dW=E_c \cdot A \cdot L_0^2 \cdot \alpha_c^2 \cdot (dT)^2$$

where $E_c$ is the elastic modulus which is representative of the crystalline phase.

For this case, we will leave the expression for work done in the crystalline phase as $$dW = (E_c \cdot dL) \cdot A \cdot dL = E_c \cdot A \cdot dL^2$$

Entropic Forces Related to the Elastomeric Phases

At the same time, heat is being absorbed by neighboring molecules, which are entropic in nature. The entropic phases absorb work created by the surrounding crystalline phases. We provide the mechanical expression for work, which is conformance force (f) under compressive pre-load times, a change in length:

$$dW = f \cdot dL$$

This retractile or conformance force (f) can be expressed as $$f = (T)(\partial f / \partial T)_{P,L} + \frac{(C_P - C_V)}{(L_0 \alpha_r)}$$

We must be aware that the force coefficient and the heat capacities are parameters of the exact function of free energy (F) of the elastomer. Therefore, we must integrate each term in accordance with the particular variable to which that term reacts. Therefore, $$dW = f \cdot dL \cdot dT = \left[ [(\partial f / \partial T)_{P,L}](dT) dL + \left[ \frac{(C_P - C_V)}{(L_0 \alpha_r)} \right] \right] \cdot dL$$

The above equation can be expressed in extrinsic terms of mass where mass is expressed as the mass density ρ, area A and volume $V_0$ as follows:

$$dW = \left[ [(\partial f / \partial T)_{P,L}(dT)(dL)] + \rho A \left[ \frac{(C_P - C_V)}{(L_0 \alpha_r)} \right] \right] \cdot (dL)$$

The foregoing attributes work energy associated with entropic forces. The directions of these forces are not determined by this energy equation. When work energy of the crystalline phase is exactly absorbed by the elastomeric phases during heating, a randomizing process must occur. Therefore, $$dW = -dW$$

Work energy of the expanding crystallites and spherulites can be absorbed by the elastomer during randomizing or ordering processes. This equation only relates to equating work of expanding crystallites with energy absorbed during randomizing processes. It does not intend to mathematically describe what is happening during ordering steps of the various processes.

The encapsulant mass must have some minimum volume of elastomeric morphology $V_r$ mixed with crystalline morphology $V_c$ to make up the total morphology $V_t$. This minimum volume of elastomeric morphology $V_r$ is finally established by these equations derived herein. Work imparted by the expanding crystallites and spherulites is equated to the energy absorbed by elastomeric matrix interconnecting the crystallites and spherulites. Therefore, $$E_c \cdot A \cdot L_0^2 \cdot \alpha_c^2 \cdot (dT)^2 = [(\partial f / \partial T)_{P,L}(dT)(dL)] + \rho A \left( \frac{(C_P - C_V)}{(L_0 \alpha_r)} \right) dL \right]$$

Only entropic energy is involved in conformance. Internal energy is moderately affected by these thermal changes. However, these are typically minor in the elastomeric phases. Therefore, $$[E_c \cdot A \cdot L_0^2 \cdot \alpha_c^2] dT / [(\partial f / \partial T)_{P,L}] = (dL)$$

Generalizing $L_0$ to L, $$[E_c \cdot A \cdot \alpha_c^2] dT / [(\partial f / \partial T)_{P,L}] = (dL)/L^2$$

Integrating, $$[E_c \cdot A \cdot \alpha_c^2 \cdot \Delta T] / [(\partial f / \partial T)_{P,L}] = (\Delta L)/L_0$$

where $(\partial f/\partial T)_{P,L}$ is a calculated constant from the measurement of conformance force (f) If the retractive or conformance force is measured at constant volume or constant elongation conditions, the heat capacity terms do not need to be measured and are obviated.

When constant volume or constant elongation conditions are not observed, then heat capacity terms must be evaluated. We can use units where $E_c$ is in terms of pounds/cm² $^{and}$ to utilize the conversion factor of gram calories to 94.1 pound·cm. Separating variables and integrating, $$E_c \cdot A \cdot \alpha_c^2 \cdot \Delta T^2 = [(\partial f / \partial T)_{P,L} \Delta T (\Delta L / L_0)] - 94.14 \rho A \left( \frac{(C_P - C_V)}{\alpha_r} \right) (\Delta L / L_0)$$

Where $[(\partial f/\partial T)_{P,L} \Delta T]$ is the same as (f), the measured retractive force at the maximum temperature excursion, $$E_c A \cdot 60 \, _c^2 \cdot \Delta T^2 = [f - 94.14 \, \rho A\{[C_P - C_v]/\alpha_r\}](\Delta L/L_0)$$

or, $$[E_c \cdot A \cdot \alpha_c^2 \cdot \Delta T^2 / [f - 94.14 \, \rho A\{(C_P - C_v)/\alpha_r\}]] = (\Delta L/L_0)$$

Since ΔL represents the elastomeric phases and $L_0$ represents the crystalline phases, we have a one-dimensional representation of the forces on the system. Translating into the 3-dimensional system, $$\frac{V_r}{V_c} = \frac{B_c \cdot A \cdot \alpha_c^2 \cdot \Delta T^2}{f - 94.1 \rho A\{(C_P - C_V)/\alpha_r\}}$$

To read the general qualitatively:

As the crystalline mass $V_c$ increases, the relative thermal well mass $V_r$ must increase.

As the temperature excursion $T_1$ increases, the relative thermal well mass $V_r$ must increase As the density ρ of $V_1$ increases, the relative thermal well mass $V_r$ must increase.

As the heat capacity ($C_P - C_V$) increases, the relative thermal well mass $V_r$ must increase.

As the elastic or bulk modulus for the crystalline phase increases, the relative thermal well mass $V_r$ must increase to compensate for the developed forces.

As the crystalline component coefficient of expansion $\alpha_c$ increases, the thermal well mass $V_r$ must increase As the elastomeric component coefficient of expansion $\alpha_r$ increases, the thermal well mass $V_r$ can decrease.

The mixed crystalline/elastomeric compositions of our invention allow internal energy to be re-distributed to minimize internal stresses and to minimize the stresses at the IC/assembly interface—if one has considered the differential CTEs with respect to the IC/assembly.

Epoxy Systems Having High Heat Resistance

An experiment like Example 1 was carried out using a known high heat resistance and low CTE epoxy resin to contrast the suitability of the urethane based encapsulants of the invention and traditional materials used to encapsulate and to demonstrate that the proportions of thermodynamic domains as set forth herein are required for the results shown in the invention electronic devices. In this experiment, the raw material ingredients were selected for their lack of ionic contaminants.

Part A 28.00 grams of Quatrex 2010 epoxide (Dow Chemical) 30.00 grams of PY322 epoxide (Ciba Geigy), 0.6 grams of isocyanato tri-methylene trimethoxy silane (Y9030, Union Carbide), 1.00 grams of Aerosil R202 silica (Degussa), and Novacite L207A silica (Malvern Chemical) were blended. The materials were mixed and heated to 200° F. for 1 hour and then degassed at 5 mm Hg reduced pressure for approximately 15 minutes until bubbles disappeared. The resulting polymer Part A was packaged in one side of a 50 cc dual cartridge.

Part B 26.00 grams of nonylphenol (Aldrich Chemical), 12.00 grams of n-ethylaminopiperazine (Texaco Chemical), 0.60 grams of Y9030 Silane (Union Carbide), 1.00 grams of Aerosil R202 (Degussa), and 60 grams of Novacite L-207A silica (Malvern Chemical) were blended. The materials were mixed and heated to 200° F. for 1 hour and then degassed at 5 mm Hg reduced pressure for approximately 15 minutes until bubbles disappeared. The resulting polymer Part B was packaged in one side of a 50 cc dual cartridge.

Mixture of Part A with Part B

Parts A and B were dispensed pneumatically side-by-side through a static mixer tip (nozzle) and onto copper clad and BT (bismaleimide) boards in globs. The dispensing was difficult. The working time exceeded 10 minutes. All sample globs were placed in the 100° C. furnace for 60 minutes and removed. The hardness was measured at 78 Shore D. Only slight bubbles were observed on the surface of the cured globs.

A sample droplet was placed in the oven for 30 minutes at 200° C. Slight striations but no bubbles were seen after cool down to room temperature. The samples on copper clad and BT boards were then exposed in a pressure cooker representing two atmospheres for one hour. Samples of globs on copper clad boards and BT boards were placed in the solder bath for 15 seconds. No degradation or bubbling was observed, but the globs debonded from the BT boards after exposure longer than 15 seconds for up to 2 minutes.

Re-Definition of Epoxy Composition in Terms of Crystalline and Amorphous Portion Content:

| Part A | | |
|---|---|---|
| Quatrex 2010 epoxide | crystalline/glassy | 28.00 grams |
| PY322 epoxide (Ciba Geigy) | crystalline/glassy | 30.00 grams |
| Isocyanato tri-methylene trimethoxy silane | crystalline/glassy | 0.6 grams |
| Aerosil R202 silica | crystalline/glassy | 1.00 grams |
| Novacite L207A silica | crystalline/glassy | 60.00 grams |
| Part B | | |
| Nonylphenol | crystalline/glassy | 26.00 grams |
| N-ethylaminopiperazine | crystalline/glassy | 12.00 grams |
| Y9030 Silane | crystalline/glassy | 0.6 grams |
| Aerosil R202 | crystalline/glassy | 1.00 grams |
| Novacite L-207A | crystalline/glassy | 60.00 grams |

This composition is essentially entirely crystalline/glassy and thermostatic.

Conclusion:

Tests in the manner of Example 1 showed that these globs, without humidity preconditioning, were capable of withstanding solder bath conditions for in excess of 15 seconds and for up to 2 minutes when not attached to rigid printed circuit board substrates. These same samples, however, indicate poor performance in terms of debonding from copper clad boards and BT boards for exposure times as little as 15 seconds.

The samples on BT and copper-clad boards did not degrade but debonded after solder-dipping for 15 seconds on both BT and copper-clad boards. This encapsulant material apparently has sufficient resistance to bond breaking, but insufficient thermal well capability to prevent internal stressing and debonding when placed on rigid substrates.

Globs of the above epoxy encapsulant on copper clad and BT boards are representative of commercially available mineral-filled highly temperature resistant epoxy encapsulants and their performance demonstrates the fallacy of trying to match coefficients of expansion between the substrates and the encapsulants when it is also desired that the encapsulants have the ability to stress-relieve internally.

Silicones

Silicones are candidates for having sufficient thermal wells for reducing internal stresses, but since silicones are limited by their inability to stop moisture and salt migration they are not viable candidates for electronic device encapsulant use. Consequently, polyurethanes stand out as the major candidate materials for containing thermal wells and the description will continue with respect to these viable materials.

The Relationship of Heat Flux to the Thermal Well's Ability to Absorb Heat within a Certain Time Period Therefore, an effective encapsulant resin will have the largest thermal well possible—the largest possible rate of change of strain with respect to time coupled with the thermal coefficient of modulus. This factor will create the largest possible capacity for the polymer to conform or contract as it makes a transition for state ($S_1$) to ($S_2$). The elastomer will have to accomplish all of this with minimum kinetic restrictions. So, one uses an encapsulant that will initially have little or no strain at the interfaces. In other words, the elastomeric encapsulant will have randomly dispersed relaxed polymer chains and crosslinks at room temperature—which is convenient because room temperature is typically essentially the same as the working temperature of the encapsulant/IC assembly. As heating occurs from the soldering process, differential strain will build in localized areas due to the general equation:

$$\Delta L = L_0 \times \Delta CTE \times \Delta T$$

A typical space within an encapsulant IC/assembly where strain (ΔL) occurs to a substantial degree is at the corners of the IC. In this localized area, the encapsulant can stretch, compress or conform because we have selected an elastomer. So, what is gained by utilizing an elastomer? The localized straining (stretching, compression or re-conforming) that is produced at the corners of the IC can be relieved by other portions of the encapsulant. The non-contact (air-cure) surfaces have the particular freedom to do so. So as localized strains occur at the corners of the IC, the relaxed portions of the encapsulant can acquire some strain to relieve the excessive strains in the localized areas. By comparison, non-elastomeric encapsulants cannot accommodate the slight CTE mismatches at the interfaces because their properties are essentially based on crystalline or glassy structure that are Hookean (have a positive coefficient of expansion).

In the present invention, the elastomeric encapsulant resin is designed so that it has the maximum density of straight chain structure without leading to thermoplasticity. Also the design maximizes the difference between the entropy of the state ($S_b$) and state ($S_a$). State ($S_b$) will be its most ordered condition and state ($S_b$) will be its randomized state while the transition between the two will absorb heat and function as the thermal well. In even the most ideal elastomers, the ordered state will be represented by pleated chain structure which occurs when each linear polymer chain is extended to its maximum end-to-end length. It turns out that this pleated chain structure becomes the limiting condition for ordering within the polymer chains. For all elastomers, even including an ideal elastomer, the most ordered state is limited to this structure. Since there is a limit to the amount of order that can be designed into state ($S_a$), one must concentrate on designing the elastomer to have maximum randomness in state ($S_b$). We will see that maximizing the randomness of the chain in state ($S_b$) relates to minimizing the average end-to-end distances of all the possible random states.

So far, attention has been directed to the overall thermodynamic factors. However, kinetic factors are an important real-life consideration. One must take into consideration whether the maximum number of random states, leading to a minimum average end-to-end chain distance, is actually attainable. Kinetic factors might limit the system design options. In other words, the ability of the elastomer to act responsively (kinetically) by overcoming the barriers to rotation to achieve these states is of prime importance. So one must take into consideration that designing the elastomer for a minimal lack of time dependence in overcoming the barriers to rotation is required for an effective entropic thermal well.

In the invention, the overall goal is to provide enough entropic thermal well character to the encapsulant so that the encapsulated IC/assembly will survive the soldering process. Ultimately, the amount of heat introduced into the system during soldering could over-ride the entropic and enthalpic thermal wells. At that point, absorbed heat becomes translated into internal energy and potentially destructive molecular vibrations. It is this type of energy that eventually breaks bonds. But, in the meantime, the thermal wells have provided a service in putting off the time before bonds are broken and transfer that energy to the randomness and conformance of the rubbery encapsulant. If the system is correctly designed, the soldering processes will have been completed and the system cooled before any bond destruction occurs. Thereafter, the IC/assembly and encapsulant elastomer returns to room temperature; the differential strains at the interfaces are relieved, and the thermodynamic reversibility of the rubbery encapsulant releases its heat to the surroundings while the polymer chains achieve, as closely as possible, their initial random conformations.

Next, consider the internal stresses rather than internal strains. After all, it is the stressing at the interfaces that really destroys the IC/assembly. The stresses at the interfaces relate to the product of the differential strain ΔL times the modulus of the elastomer. To minimize internal stresses, the same influences pertain as for internal strains. It is often a better strategy to choose a rubbery elastomer than to choose a matched-CTE resinous, high-modulus polymer such as an epoxy or acrylate that are crystalline or glassy and have characteristics that are Hookean. One of the less obvious advantages of a rubbery elastomer is that stresses developed during heating do not remain localized at the corners of the ICs, or along the wire connections. The rubbery elastomer can stress-relieve in these localized areas by virtue of averaging the stresses by conformance and randomization throughout the elastomeric encapsulant. So, for example, the large volume of non-contact surfaces is free to stress-relieve the more extreme localized stresses. In doing so, these regions also achieve some randomized state until the thermal well process is exhausted. By selecting the optimum encapsulant formula based upon the delicateness of the IC/assembly circuitry and the expansiveness of its geometry, the degree of internal stressing that occurs during soldering can controlled. On the other hand, non-elastomeric encapsulants do not allow the same degree of control.

It is most important that the polymer be sufficiently elastomeric, and the response time be sufficiently fast to effectuate stress-relief during the temperature excursion and the return excursion to room temperature. This character can be described as low hysteresis. In this case, however, the hysteresis relates to the amount of stored heat within the constrained elastomer as it is temperature-cycled in a geometrically constrain environment (related to the temperature coefficient of force) rather than the typical case where a rubber is strained at constant temperature (related to the strain coefficient of force).

The best way to create rubbery character within a polymer is to design that structure to have a minimum end-to-end chain distance while the rubber is in its random state. The rubber will be in its most random state when it is relaxed—not having external forces applied to it. The rubbery character of the polymer is experienced when an external force is applied to the rubber, either by stretching it or by contracting it. As the polymer is stretched, the chains are extended to the degree that is required to conform to the external force. Stretching (or deformation, whichever way it occurs) causes the randomly oriented polymer chains to achieve some degree of pleated structure.

It is too simplistic and entirely inaccurate to view the restoring force as springs within a rubbery polymer. In fact, the restoring force results from the original degree of randomness of the polymer chain configuration. In the case of all rubbery polymers, the restoring force relates entirely to the probability that the chains will reside in a number of random states upon release of the external force. One way to visualize this anomalous behavior of a rubbery polymer is to consider the average end-to-end distance within a relaxed polymer chain. If the average end-to-end chain distances of all the possible random configurations of the relaxed state is small, then the average extension of the random end-to-end distances to the limiting pleated chain structure will be large. A large magnitude of average polymer chain end-to-end extension relates to macroscopic extensibility of the rubbery polymer and to the magnitude of the thermal well. This concept is simplistic but goes a long way to describing the nature of a rubbery polymer.

The Effect of the Polymer Chain End-to-End Distances on the Magnitude of the Extensibility of the Rubbery Polymer The extensibility of the polymer has to do with the difference between the end-to-end distance of the polymer chain in its most extended (ordered) state less the end-to-end distance of the polymer chain in its relaxed (random) state. Polymers in a relaxed state will have a random walk structure. This structure can be visualized by considering the number of ways a drunk can take a walk on (two-dimensional) pavement. The drunk may have taken a long walk where the overall distance is calculated by multiplying his average stride times the number of steps he had taken. However, in effect, one needs to know only where the drunk started and where he ended up to determine his effective walking distance. These concepts pertain to the average chain length of a polymer and the end-to-end distance in its relaxed state. More thoroughly, this process can be extended to three dimensions and has otherwise been described as a random walk for the polymer in space. A key concept here is that the random walk pertains to random structure, and random structure pertains to a mono-dimensional polymer in its relaxed state.

If one considers the most ordered structure for a general type of polymer structure, it will be a pleated straight-line path (except for the most trivial case). In the trivial case, an sp carbon-carbon (or other atomic structure of the chain) will be perfectly straight chain.

Evaluation of the End-to-End Distances

The end-to-end distance is the average distance between the two ends of a polymer chain. This end-to-end distance is determined by the summation of the in-chain bond distances and taking into consideration that: 1) random polymer chains can be bent into any conformation within three dimensions; 2) ordered polymer chains will have pleated structure in two dimensions. To determine the effective end-to-end distance for the random polymer chain in space, the $I_x$, $I_y$ and $I_z$ components for each random step vector I must be determined for every possible conformation. Then the components of these random steps must be summed and the magnitude of the net end-to-end displacement vector determined for each possible conformation. The magnitudes of the vectors for every possible conformation must then be summed and the average end-to-end magnitude all conformations determined.

To determine the effective end-to-end distance for the ordered polymer chain, the same calculations pertain except that only the pleated chain conformation need be considered. The Ix and Iy components of the vector for each pleated chain segment must be determined for only this single conformation. Then the components of these vectors must be added. The magnitude of the sum of Iy vectors will be zero. The summation of the Ix vector components must be summed to determine the end-to-end chain extension along the x-axis.

Each type of polymer has in-chain bonds that are encouraged to twist to one degree or another. For example, carbon-carbon bonds which contain few or no substituents (other than hydrogen) are not particularly encouraged to twist out of a pleated carbon-carbon structure lying within two dimensions. However, if the carbon-carbon bonds contain larger substituents such as methyl or larger alkyl groups, each carbon-carbon bond having a substituent is forced to twist out of a two-dimensional plane into more complicated 3-dimensional conformation. This is because the substituent of carbon ($C_1$) is bulky enough to interfere with the methylene-bridged substituent in carbon ($C_2$). Only a twist of the in-chain carbon-carbon bond will alleviate the mutual steric overlap of bulky substituents such as alkyl groups. To test the effect of substituents on the two-dimensional long amorphous segments, for example, compare similar structures of a polyurethane having poly-oxy-ethylene oxide polyether soft segments with a polyurethane having poly-oxy-propylene oxide polyether segments, both of 1000 molecular weight. Since the poly-oxy-ethylene oxide polyether soft segments do not have alkyl substituents, there is nothing encouraging this oligomer to exist in any other structure than a two-dimensional pleated conformation. That is to say, this structure can have conformations in three dimensions, but the probability that the chain will have much three-dimensional structure is relatively low. By comparison, a poly-oxy-propylene oxide polyether has substituents that require every third carbon-carbon in-chain bond to twist on the order of 120 degrees to allow the methyl substituent of carbon $C_1$ to avoid contact with the in-chain methylene substituent of Carbon $C_2$. Back to random walk concept, the poly-oxy-ethylene oxide polyether soft segments in the random state will have longer average end-to-end distances than a poly-oxy-propylene oxide polyether structures because the latter is taking a more three-dimensional walk. As polymer chains take a three dimensional walk, the conformational twists can be isotactic, syndiotactic or atactic. In other words, the chain can be twisted right-handedly or left-handedly, twisted into some alternating pattern or it can have random twisting. In all of these cases, the combined twisting will result in shorter end-to-end chain distances than if there were no twisting at all.

The Effect of sp, sp2 and sp3 In-Chain Bond Hybridization on End-to-End Polymer Chain Distance Random Structure for Polymers of Various Hybridizations Polymers which have sp carbon-carbon, sp2 carbon-carbon or sp3 carbon-carbon bonds (or in-chain non-carbon atoms) can be visualized as taking random walks. The random walk structure of sp-hybridized structure is the trivial case. It will be exactly linear based on making a 180-degree straight-line extended path in space. This condition is invariant between random and order structure. Therefore, such a structure will be devoid of any entropic thermal wells.

Polymers which have sp2 hybridized bonds can be visualized as taking random walks by making 120 degree turns at each in-chain atom within space. Both cis- and trans-sp2 double-bonded structure can be wound into tight spirals to achieve minimal end-to-end distances by having their carbon-carbon single bonds twisted. All other intermediate two-dimensional structures and three-dimensional conformations are possible for sp2 structures.

Polymers that have sp3 hybridized bonds having (109 degree) tetrahedral bond angles can be visualized qualitatively. It is seen that the more the in-chain carbon-carbon bonds are twisting out of a plane, the more likely the end-to-end distances are to be minimized. The less the carbon-carbon in-chain bonds are twisting out of a plane, the more likely the end-to-end distances are to be maximized. Therefore, bulky substituents play an important role in determining the rubbery character of a polymer. The best case in point is polyethylene, which has no substituents on the chain and manifests very little rubbery character.

Consider another case of polyurethanes synthesized form poly-oxy-ethylene ether polyols where there are no substituents in the amorphous phase. The simplest case is as well as polyurethanes of poly-oxy-ethylene ether polyols. Upon building models, it is easily seen that the poly-oxy-ethylene ethers have the electron pairs on their ether oxygens. Each electron pair creates an electron-rich microenvironment environment around each attendant ether oxygen group.

Therefore, the ether oxygens will want to maximize separation from one another, and the electron pairs will want to point in opposite directions for each successive ether oxygen in the chain. Such a separation and orientation requires that pleated chain structure is established, and this is the most linear structure possible.

One substituent per every few in-chain atoms will encourage twisting leading to shorter end-to-end chain distances and greater random structure. For example, polyether polyurethanes composes of poly-oxy-propylene units have one methyl substituent per each 3-atom-in-chain propylene unit leads to twisted conformational structure. Polyether polyurethanes have considerable rubbery character. Polybutadiene polyurethanes based on oligomeric soft segments having some pendent vinyl structure (derived from the polymerization of 1,3'-butadiene) have considerable rubbery character. Also, silicone polymers derived from dimethylsilicone polymers (having alternating silicone-oxygen in-chain bonds where the dimethyl substituents reside on every other chain member) have considerable rubbery character.

Ordered Structure for Polymers of Various Hybridizations

Consider, for example, the maximum end-to-end distance for conjugated sp2 hybridized structure such as carbon-carbon double bond structure along a single coordinate. Its maximum extension will result in a trans-pleated structure with 120-degree bond angles to adjacent carbons. Maximum end-to-end distances in cis-double bonded conformations will be pleated with 120 degree bond angles between adjacent carbon bonds and will have some lesser end-to-end distance than trans doubled bonded structures. The maximum end-to-end distances in sp3-hybridized structures will be pleated with 109-degree bond angles between adjacent in-chain bonds.

The Bulkiness Factor in Determining the Resistance to Rapid Conformational Changes Upon heating, the interfaces between the encapsulant and certain localized areas of the IC/assembly undergo differential expansion. The lowest modulus material (the encapsulant) starts to strain as internal stresses occur at the surfaces of the IC, wires and substrate. The polymer chains become more ordered and the some of the initial random structure starts exhibiting pleated structure at state ($S_1$). As the heating process continues, more polymer chains order and more pleated structure is created to relieve the increased localized stresses. As the heating process continues, polymer chains randomize and pleated structure is lost in state ($S_2$) having conformed to localized stresses of ($S_1$). Again, the polymer chains cool to room temperature after the solder dip is completed achieving state ($S_3$).

The ability of the structure to make conformational changes relates to the energy hill required to be surmounted in achieving each of these new structures. In other words, barriers to rotation must be overcome in a timely manner. The barriers to rotation are created mainly by the steric hindrance of neighboring substituents twisting past one another. The ability of the polymer to function as a thermal well relates to the design of the polymer chain and its substituents to overcome these barriers to rotation.

The Restoring Force for a Stretched Rubber

A classic experiment which exemplifies the anomalous behavior of rubber is established thusly: a rubber band is suspended from a hook and a small weight of a few grams is attached to the rubber band so that it is hanging in a stretched condition. Then the rubber band is heated. Upon heating, the rubber band contracts. What accounts for this anomalous contraction with heating when virtually all other materials in nature exhibit an expansive action with heat?

First, the rubber band has long chains that are essentially three-dimensional and extend in all directions in random conformations. However, as a rubber band is stretched, many more of the chains become oriented along the long-axis of the extended rubber band corresponding to state (S1) in the heated encapsulant. In the process, the rubber band achieves some degrees of order. The polymer chains of the stretched polyisoprene carbon-carbon structure of a rubber band are of a pleated structure in state (S1). The pleated chain structures have some barriers to bond rotation as they attain near ultimate elongation before breaking. The poly-cis-isoprene of natural rubber (from which the rubber band is vulcanized) contains some in-chain methylene groups that have pendant methyl groups. These methyl groups, along with some in-chain unsaturation, provide slight barriers to rotation. The simplest means of visualizing the pleated sheet structure and the barriers to rotation in achieving perfect pleated structure is to view the Newman projections of poly-cis-isoprene.

Upon heating: In response to the strained chains and continued heating, certain inherent barriers to rotation are overcome, and many new conformations become possible corresponding to state ($S_2$) in the encapsulant. It is the abundance of these new conformational states that creates the probability of attaining these many new conformations. The increased probability of new states being formed, and that these new states will have conformational structure directed to the short transverse axes becomes the driving force for contraction of the rubber band or conformance where necessary. The number of conformations created by heating the rubber band are increased thousands of times as one considers the number of substituent groups in a cis-polyisoprene polymer. then upon cool down to room temperature, a return of random states is achieved ($S_3$). The bulkier the constituents, the greater the barriers to rotation. However, one must remember that the substituents that become the barriers in the first place, have created the twisted structure.

The heating of the encapsulant allows its chains to achieve more randomized structure because barriers to rotation are overcome, and many new random states are formed. So, the overcoming of each and every conformational barrier increases the possibility for randomness in state (S2) as the encapsulant reaches its maximum temperature excursion.

The potential for stress relief within a rubbery encapsulant has been emphasized. This type of stress relief is not available in resinous polymers such as epoxies, acrylates because the cross-linking processes make them mainly tetrafunctional, rather than mainly difunctional, like elastomers. They have a glassy-type of structure, which has Hookean properties.

Polyurethanes have been previously criticized for having a lack of thermal stability. For that reason, they have not been considered as serious candidates for the encapsulation of IC/assemblies. Our invention utilizes special urethane-based polymer structure for encapsulating IC/assemblies. The invention meets the practical requirements of an ideal elastomer (above).

Creating Thermostatic/Crystalline or Glassy and Thermodynamic/Amorphous Domains or Portions in Polyurethane Elastomers Polyurethane structure is morphologically distinct from other polymers because glassy (hard) phases and amorphous (soft) phases can be incorporated into the same composition to provide a combination of rubbery and Hookean properties.

Glassy phases are characterized by the close packing of polymer chains. Chain packing is encouraged by attractive intermolecular forces such as hydrogen bonding, ionic interactions, ion-dipole interactions dipole/dipole interactions and Van der Waals forces, and by regular molecular structure can allow packing to occur. Urea and urethane linkages provide regular structure and strong hydrogen bonding, so tight packing can occur around these linkages. The interaction amongst aromatic rings and their regular structure, introduced as in-chain adjacent groups to the parent isocyanates and aromatic amines also encourage packing. To some extent, aliphatic ring structure also allows for packing around urea and isocyanate linkages.

Amorphous phases are characterized by a lack of packing and considerable void spaces between chain structures. As twisting occurs within the in-chain carbon-carbon (or other in-chain) bonds random loose winding occurs along the length of each chain, and inter-chain twisting and winding can occur.

Hardness and relatively high modulus, those properties associated with providing mechanical protection to the IC/assembly, are provided by the glassy phases. Glassy phases are created by the correct selection of isocyanates and chain extenders. Low modulus, that property associated with minimizing internal stressing, is provided by the amorphous phases. Amorphous phases can be created by selecting the optimum amorphous oligomers and reacting these with isocyanate that had been knitted to the glassy phases. The degree of differentiation between the glassy and amorphous segments plays a substantial part in how effective each is achieving its purpose. It is our experience that highly differentiated glassy/amorphous structure is superior to diffuse glassy/amorphous structure for achieving a combination of mechanical protection from the glassy phases and low modulus from the amorphous phases.

Using a Synthesis Design for Achieving Maximum Extensibility of Amorphous Polymer Chains In order to maximize the entropic thermal well capability of the amorphous phases, one needs to design the structure for maximizing the difference between the average end-to-end distances of the ordered and random states. The random and ordered portions of the polymer will exist within the amorphous phases of the polyurethane. So maximum extensibility of the polyurethane will need to be achieved by selecting the most advantageous amorphous oligomers.

It has been determined that highly differentiated glassy/amorphous structure is superior to diffuse glassy/amorphous structure for achieving maximum extensibility. Highly differentiated structure produces domains of glassy and amorphous phases or portions that have the maximum volume of phase-segregated material per mixed boundary material. Diffuse structure produces the domains of glassy and amorphous phases that have the minimum volume of phase-segregated material per mixed boundary material. In order to maximize the thermal well capability of the amorphous phases, one needs to design the structure for the maximum volume of phase-segregated material per mixed boundary material, thus minimizing interference from a glassy boundary environment.

To realize maximum extensibility of amorphous polymer chains: (1) the amorphous oligomer fluid matrix is designed so the developing glassy domains are only minimally soluble; and, (2) differential reactivity is provided between the glassy and amorphous phases. It is desirable to allow the development of the glassy domains to become mature before they are knitted into the amorphous segments. This encourages the most discrete glassy/amorphous structure differentiation.

The major polyurethane formula reactants (the isocyanate prepolymer, chain extenders and amorphous oligomers) have the peculiar ability to start out as rather neutral non-polar materials in situ and produce more polar linkages. The isocyanate group itself is non-polar. If the isocyanate has parent aliphatic or aromatic structure, the overall character of the isocyanate is non-polar. The isocyanate can have some induced polarity. So it can be considered to be intermediate between having polar and non-polar character. The oligomeric groups and chain extenders can range from having polar character to non-polar character.

As the reactions proceed between the isocyanate groups and the active hydrogen groups of the chain extenders and amorphous oligomers, urethane or urea groups are produced with are far more polar than the initial ingredients. Consequently, the first urethane or urea phases to be formed are substantially more polar than the parent matrix ingredients. These polar materials create nucleation sites for the creation of glassy domains within the amorphous matrix liquid.

One should not choose glassy-forming chain extenders that are totally insoluble (or nearly insoluble) in the amorphous oligomer and isocyanate. Such a design strategy can create inconsistency in the final product based on the developing heat history of the reaction mixture. However, one can choose glassy-forming chain extenders that are have a substantially more polar character than the amorphous oligomer. Then as the glassy domains are formed, the polar character of the developing urethane or urea chain-extending linkages will have their polarity enhanced so the glassy domains will be on the brink of being insoluble or immiscible, but allowing sufficient compatibility for the amorphous phases to knit into the glassy domains. Phase segregation is enhanced by this design. Polyureas are more polar than polyurethanes. Therefore, selecting the chain extenders from parent difunctional or multi-functional amines is advantageous.

If one designs the chain extenders to react faster with the isocyanates than the amorphous oligomers, the isocyanate/chain extender glassy segments have a chance to form rather large and mature domains within the amorphous oligomer-matrix fluid. Then the amorphous oligomers react and knit the glass domains together to form highly differentiated glassy and amorphous morphology. In general, the two classes of isocyanates, aromatic isocyanates and aliphatic isocyanates, have substantially different reactivities: Aromatic isocyanates react substantially faster than aliphatic isocyanates. In general, there are three classes of active-hydrogen groups effective for reaction with isocyanates for encapsulant materials: 1) aliphatic amines; 2) aromatic amines; 3) aliphatic oligomers bearing primary and secondary hydroxyls. The reactivities of these two classes of isocyanates with these three classes of active-hydrogen bearing materials can be ranked (fastest to slowest combinations, although there is some overlap within these distinctions):

1. Aromatic isocyanates with Aliphatic amines
2. Aromatic Isocyanates with Aromatic amines
3. Aromatic Isocyanates with Aliphatic Hydroxyls.
4. Aliphatic Isocyanates with Aliphatic Amines
5. Aliphatic Isocyanates with Aromatic Amines
6. Aliphatic Isocyanates with Aliphatic Hydroxyls The reactivity differences between aromatic isocyanates/aliphatic amines and aliphatic isocyanates/aliphatic hydroxyls is very distinct, and phase segregation can be easily encouraged by using the differential reactivities of this combinations of groups. However, for heat instability reasons (to be described later on), we want to avoid the use of aromatic isocyanates, if possible. Therefore, one would rather select aliphatic isocyanates/aliphatic amines reactions or aliphatic isocyanates/aromatic amines reactions for creating of glassy domains, as much as possible. One wants to avoid the formation of bonds from the reaction of aromatic isocyanates with aliphatic hydroxyls altogether.

It has been found that a combination of approaches provides sufficient differential reactivity: Seeding the development of glassy domains by selecting aromatic isocyanates/aliphatic amines parent reactants (which also functions as a thixatrope); or by selecting aromatic isocyanate/aliphatic amines parent reactants for completion of the building of glassy domains. Then by selecting aliphatic amines and hydroxyl-bearing oligomers the amorphous polymer chains can be knit to the glassy domains. Selecting optimum stoichiometric ratios of these combinations of parent reactants maximizes differential reactivity.

The length of the amorphous polymer plays a significant role in achieving maximum extensibility of the amorphous polymer chains. In general, the average length of the amorphous oligomer chains needs to be at least 300 daltons; and it is better that the length be at least 1000 daltons between cross-links or between the glassy domains. It is desirable to furnish sufficient modulus to provide mechanical protection. On the other hand, we want to minimize modulus in order to create minimum stresses within the encapsulant. One means of achieving this combination of properties is to select a reaction combination of aromatic isocyanates with aliphatic amines or aromatic isocyanates with aromatic amines to produce the glassy domains. This combination produces extremely hard glassy segments. Then selecting a combination of aliphatic isocyanates with aliphatic hydroxyls produces low modulus amorphous segments.

Providing Enthalpic Thermal Wells

Aromatic isocyanates, aromatic amines and polybutadiene structures furnish conjugated double-bonded structure capable of providing enthalpic thermal wells.

Producing Minimal Internal Stressing in Polyurethanes

Polyurethanes can be designed for creating minimal stressing at the various interfaces with the IC/assembly by minimizing the modulus of the entire morphological structure and, in particular, the amorphous segments. Selecting a combination of aliphatic isocyanates with aliphatic hydroxyls produces low modulus amorphous segments.

Dissipating Localized Stresses in Polyurethanes

Dissipating localized stresses in polyurethanes is accomplished by ensuring that the various amorphous segments are sufficiently integrated through the glassy domains. Therefore, the glassy domains must themselves have the ability to re-align and conform to the transient internal stresses created during thermal excursion of the soldering process.

Maximizing Thermodynamic Reversibility and Minimizing Mechanical and Thermal Hysteresis in Polyurethanes The bulkiness of substituents and their proximity to one another play an important role in allowing the chains to conform to stresses in a timely manner. By doing so, the thermodynamic reversibility of the polyurethane can be maximized and the mechanical and thermal hysteresis in polyurethanes can be minimized. Polybutadiene oligomeric segments have vinyl substituents, the vinyl substituents residing on approximately every 10 to 15 in-chain carbons. The vinyl group is somewhat bulky causing the in-chain carbon bonds to twist and re-conformation as necessary to minimize steric hindrance between this substituent and the chain.

Providing Sufficiently High Strength Bonds in Polyurethanes Capable of Surviving The Soldering Processes The urethane polymer chains need to have sufficiently strong bonds of chain extension and cross-linking to withstand bond breaking, degradation and reversion during soldering. Accordingly one wants to form the maximum number of strong bonds, and minimize the number of weak bonds (weak links) in the chain. A good strategy is to select polyurethane amorphous segments that provide strong bonds. It has been found that straight hydrocarbon chain oligomers, or hydroxyl-terminated hydrocarbon chain oligomers derived from 1,3'-butadiene monomer, provide substantially better resistance to bond-breaking at the elevated temperature conditions of soldering than do oligomers containing oxygen atoms such as the polyether polyols of poly-oxy-propylene oxide ether oligomers, poly-oxy-ethylene oxide ether polyols (Carbowaxes), polytetramethylene oxide ether polyols, or polyols of polyester such as ethylene glycol adipates, azealates, butyl adipates or caprolactones. Not wishing to be bound by theory, it is believed that the ability of these polyols to survive solder processing temperatures partially relates to the inherent bond strengths of the weakest chain links. In the case of the polyether polyols, it is believed that the weak links have to do with the reversion of the ether bonds during the soldering process.

It is further believed that the general bond strengths of the various bonds relate to the stability of the polymer towards heat degradation. For example, carbon chains containing C—C, C—H, C=C bonds will be very resistant to reversion because of the high bond energies (ability to withstand bond-breaking) involved. For example the bond energies for C—C, C—H, C=C bonds are, 80, 98 and 145 Kcal/mole, respectively. On the other hand, ether bonds require less energy to break as do C—N bonds that require only 66 Kcal/mole. The most heat-stable urethane elastomers to solder processes are those that avoid C—O—C ether bonds.

One should also select isocyanates and active-hydrogen moieties whose inter-reactions produce urethane or urea linkages that are capable of withstanding breakdown from the heat of the soldering process. It is best to produce as many polyurea linkages, taking into consideration that the best differential reactivity occurs when polyurethane linkages are formed from the slower reactions of hydroxyl-functional amorphous oligomers.

Further, one should synthesize the urethane elastomers using chain extender glassy segments and oligomeric amorphous segments having active hydrogen groups based on primary amines (aromatic and aliphatic), secondary amines (aromatic and aliphatic), guanines, (amidines), amides, primary hydroxyl, secondary-hydroxyl groups, and tertiary hydroxyl groups, in that respective order. On the basis of bond strength, it is preferred to utilize all primary amino reactants with isocyanates to produce polyurea chain extension rather than polyurethane chain extension. (This conflicts with the use of primary hydroxyl groups on the amorphous oligomers for differential reactivity and maximum differentiation of glassy and amorphous phases.) In fact, the preferred polymers are polyureas or polyurea/polyurethane combinations that we nominally refer to as polyurethanes. However, another practical consideration is that the reactivity of the polymer system needs to be slowed to such an extent that it can be mixed and dispensed in a continuous or intermittent process. Therefore, select the slower reactants from the two groups of 1) aromatic primary or secondary amines, 2) primary and secondary hydroxyl active-hydrogen oligomers.

For optimum results in terms of the resistance of polyurea bonds to breakdown from the heat of soldering, these combinations of reactive ingredients rank as follows:

a) The most stable bonds are polyureas produced from the reaction of aliphatic isocyanates with aromatic or aliphatic amines.
b) If aromatic isocyanates must be used to impart hardness for mechanical protection, then it is best to provide a stoichiometric amount of aromatic or aliphatic amines to produce urea linkages.

The theory or basis for this order of selection is that the resistance to breakdown of a polyurea linkage is best improved by providing an inductive electronics effects to the urea linkage from the parent moiety of the isocyanate. In other words, aliphatic isocyanates provide electronic induction effective whereas aromatic isocyanates withdraw electrons from the urea linkages. The theory or basis for this selection is that aliphatic or electron-donating groups diminish the electropositive character on the polyurea carbonyl group and stabilize the carbonyl group towards bond-breaking with adjacent amino bonds. Next, the resistance to bond-breaking of the polyurea linkage can be improved by selecting the parent group of the active hydrogen moiety which is an aromatic amine. An aromatic amine provides an enthalpic thermal well associated with resonance of the aromatic group.

One should avoid reacting aromatic isocyanates with hydroxyl-bearing moieties producing urethane linkages. If a urethane linkage needs to be formed (such as for differential reactivity), then it is preferred to select aliphatic isocyanates for reaction with slower-reacting hydroxyl groups to produce urethanes linkages. Not wishing to be bound by theory, it is believed that the electronic donating effects of the aliphatic isocyanate help stabilize the carbonyl group of the urethane linkage. On the other hand, the aromatic substituent on aromatic isocyanates destabilizes urethanes because of the unbalanced electron withdrawing effects on the carbonyl of urethane linkage. Polyurea linkages do not suffer from the electronic imbalance as do polyurethane linkages. So, even though the two adjacent aromatic groups create electronic deactivation to the urea linkage, they do so in an electronically balance manner avoiding the strong dislocation of electrons to one side of the urethane group.

Selecting Raw Materials

All raw materials must be first screened for levels of ionic constituents such as metals, salts of metals and their migrating tendencies. Although some materials can be selected to have higher than 100 ppm of these contaminants, the overall selection must be such that the contaminants must be less than 20 ppm, and ideally less than 2 ppm.

Aliphatic Isocyanate Prepolymer

The aliphatic isocyanate prepolymer component is preferably selected from methylene dicyclohexane diisocyanate, isophorone diisocyanate, and hexamethylene diisocyanate and is present in the amount of 3% to 50%, preferably in the amount of 25% to 35%.

Step 2 Addition Aliphatic Isocyanates

The aliphatic isocyanate from which the Step 2 additions are made are preferably selected from methylenedicyclohexane diisocyanate, isophorone diisocyanate, and hexamethylene diisocyanate in the amount ranging from 5% to 15%.

Step 2 Addition Aromatic Isocyanates

The aromatic isocyanates from which the Step 2 additions are made are preferably selected from diphenylmethane diisocyanate, toluene diisocyanate, and naphthalene diisocyanate and are present in the amount of 1% to 25%.

Chain Extenders

Aliphatic amine chain extenders can be used for the purpose of seeding the formation of glassy segment domains. If this is to be the purpose, they can also be used to create a chemical thixotrope for damming purposes. Aliphatic amine chain extenders are preferably selected from primary or secondary amines, having di-functionality or multi-functionality, preferably having a molecular weight of 2000 daltons or less, more preferable 500 daltons or less. Further the amine is preferably a diamino alkane or an alkyl, alkoyl, aryl, aroyl, or alicyclic substituted diamino alkane, i.e., ethylene diamine, piperazine, n-aminoethyl piperazine, diethylene triamine, triethylene tetramine, higher members of this homologous series, including piperazine cyclics, 1,3-bis(aminoethyl) cyclohexane, 1,4 diaminocyclohexane, m-xylene diamine. This group includes amines from the amino-capping of low molecular weight polyols such as Jeffamine D230, Jeffamine T403, Jeffamine D2000 and Jeffamine T3000. These amines are typically present in low levels, preferably at levels lower than 10% by weight of the Part B component, and ideally at a weight of less then 3% by weight of the Part B component.

Aliphatic amine chain extenders are used for the purpose of seeding the formation of glassy segment domains and for building glassy segment domains. However, aromatic amines are preferably selected as chain extenders. This includes a group of primary or secondary aromatic amines, having di-functionality or multi-functionality, preferably having a molecular weight of 2000 daltons or less, more preferable 500 daltons or less. Further, the aromatic amine is preferably 3,5-diethyl-2,4-toluene diamine (Ethacure 100, Ethyl Corporation), di-(3,5-methyl thio)-2,4-toluene diamine (Ethacure 300, Ethyl Corporation), methylene-bis-orthochloro aniline, methylenedianiline, Amicure 101, methylene-bis-methyl anthranilate, m-phenylene diamine, trimethylene glycol-di-p-amino benzoic ester (Polacure, Air Products), aromatic amine capped polyols such as Polamine 650, Polamine 1000 and Polamine 2000 (Air Products).

Amorphous Oligomers

Amorphous oligomers are necessary for creating the prepolymer, quasi-prepolymer and for imparting amorphous segments to the polymer through the Part B component. Further the amorphous segments are preferably selected from functional polymers having active-hydrogen-functional groups which are preferably primary, which can be secondary, and less favorably tertiary, the functional groups composed of a group of active-hydrogen-bearing functions, including hydroxyl groups, primary and secondary amino groups, carboxylates, primary, secondary or tertiary carbons bearing amides, amidines, urethanes and ureas. Further the amorphous segments are preferably selected from essentially straight chain structures which have the maximum ability to reconform without creating chain entanglement from chain branching. However, some slight branching is encouraged to provide for overall cross-linking integrity of the polymer. Further the amorphous segments are preferably selected from functional polymers having a molecular weight of from 100 to 10,000 daltons, but preferably of the molecular weight of 1000 to 2000 daltons. The hydrocarbons can be composes of active-hydrogen functional polymerized linear, cyclic or branched alkanes and alkenes, alkenes, alkanes or alkenes, and alkanes or alkenes polymerized with alkenes or alkanes respectively, with alkynes. Ideally, the chains will contain in-chain carbons having, on the average, substituents on every second to fifteenth carbon, but longer distances between branching being capable of producing 3-dimensional twisting and winding, atactically, syndiotactically or isotactically. Alkenes can be non-conjugated or conjugated, being either cis- or trans-, preferably having substituents which are alkyl, vinyl, halogenated alkyl or vinyl, capable of being other substituents such as acetate, acrylate, nitrile, amide, etc. These substituents can be derived from homopolymerization or co-polymerization with and amongst ethylene, propylene, butylene, vinyl, allyl, chlorinated vinyl, diene monomers, oligomers and polymers. These homopolymers and co-polymers can include combinations such as polyvinyl chloride, ethylene polymers, propylene polymers, dienes, ethylene and propylene polymers, polyisoprenes including natural rubbers, polybutylene polymers, styrenebutadiene polymers, halogenated polymers such as Viton, Hypalon and latices thereof.

Further the amorphous segments are more preferably selected from polybutadiene resins derived from 1,3-butadiene monomer. These polybutadienes can be of molecular weight of 20,000 daltons or less, preferably 1000 to 4000 daltons. These butadiene polymers are preferred to have a combination of cis- and trans- in-chain addition products from the extension of the polymerization through the conjugation of the 1- and 3 sites of unsaturation of the 1,3-butadiene monomer, as well as vinyl addition product from 1,2-addition of the 1,3-butadiene monomer. More typically, we select from a number of commercially available polybutadienes including R45HT and R45M (Elf Atochem), and R-20LM which is a lower molecular weight polybutadiene (Elf Atochem). These polybutadienes typically contain pendant vinyl groups randomly dispersed amongst approximately 20% of the unsaturation sides while the ratio of trans to cis unsaturation is approximately 3 to 1. In addition, we prefer to utilize variants of these commercially available polymers which contain a minimal amount of fugitive lower molecular weight side reaction products including vinylcyclohexl moieties. In addition, these polybutadienes can be modified by creating epoxy, ester, polyester, ether or polyether adducts, or by creating vinyl addition substituents such as styrene, polystyrene, acrylonitrile, acrylamide, acrylate, divinyl benzene, or other functions such as halogens, nitriles, etc. These amorphous oligomers (or their polyurethane or polyurea counterparts) can be present in the Part A composition at a range from 30% to 95%, preferably ranging from 50% to 70& by weight. They can be present in the Part B component in ranges from 25% to 97%, preferably ranging from 70% to 90% by weight.

Silanes

Adhesion, particularly adhesion to silicon, metals and glass is desired. To enhance adhesion, a silane coupling agent can be place in the Part A or Part B. It is preferred, however, to select silane coupling agents, having silyl ether groups capable of hydrolyzing to their respective silanols, and having isocyanato or oxirane functional groups compatible with the Part A which include isocyanato-n-propyl-triethoxysilane, 23,4-epoxy-cyclohexyl-ethyl-trimethoxy silane or oxirane-n-propyl-triethoxy silane. Silanes compatible with the Part B reagent include bis(2-hydroxy ethyl)-3-aminopropyl triethoxysilane, 3-mercaptopropyl methyldimethoxysilane, 3-amino-propyl-triethoxysilane, n-2-amino-ethyl-3-aminopropyl trimethoxy silane and glycidopropyl trimethoxy silane.

Carbon Blacks

Carbon blacks are typically necessary to provide a cosmetic function, often to hide circuitry, sometimes to prevent ultraviolet radiation from penetrating the circuitry. The selection of carbon black for this purpose requires careful selection to avoid ionic contamination of the system. Preferred carbon blacks which contain a low acidity along with low ionic levels of ionic contaminants such as Raven Black 430 (Colombian Chemical Company) are preferred.

Catalysts

In certain compositions, it is desirable to have reaction promoters present. These serve to ensure complete formation of urethane or urea reactions. However, their level is maintained at a minimum effective level to ensure sufficient working time so viscosity rise of the mixture does not become a problem during processing. Therefore included on the Part B side will be reaction promoters such as organometallic or amine promoters for the reaction of active-hydrogen materials with isocyanates. The group of amine promoters include tertiary amines such as triethylene diamine (Dabco, M&T Chemical). The group of organometallic promoters include organo-tin compounds such as Witco UL-6, or dibutyltin dilaurate, or organomercury compounds such as phenyl mercuric proprionate, or organobismuth compound such as Coscat 83 (Cosan Chemical), or compounds such as Noudex Nu-xtra 24% bismuth, or organo-lead compounds, and in a weight in the Part B between 0.001 and 5%, preferably in a range between 0.1 to 0.5 percent.

Flow Control Agents

Of importance is to ensure that the flow of the urethane Part A and Part B reagents have maximum mix compatibility to ensure an intimate mix of all the mix streams within the static or mechanical mixing chambers. One means of enhancing the compatibility is to match the viscosities and rheologies of the mix streams as well as possible. A means of achieving such a compatibility is to select flow control agents which modify the wetting of these streams, particularly as the mixed stream is laid onto the substrate and IC either by dots, ribbon streams or in a glob. Also of importance is to produce wetting of the mixed stream onto the IC/assembly in order to produce as low a profile (minimizing the radius of the crown) as possible.

Anti-Oxidants

Polybutadiene resins and their derivatives embrittle in an oxidative environment. Consequently, the encapsulant needs to be protected against oxidation. Protection against oxidation can be provided using any of a large number of inorganic and organic materials. Therefore, one selects from organic anti-oxidant compounds having good solubility and effectiveness including d,l-alpha-tocopherol, d,l-alpha-tocopheryl acetate, ascorbic acid, beta-carotene, Tinuvin P or Tinuvin 327 (Ciba Geigy), Cyanox 2246 (American Cyanamide), butylated hydroxy anisole and BHT and the like which will not introduce or form ionic salts and which will promote system compatibility and solubility.

The invention thus provides an improved electronic device able to survive solder heat exposure during soldering cycles, a method of manufacturing electronic devices incorporating encapsulated components in which the components are protected from environmental damage by an encapsulant resistant to soldering cycles, and provides such devices and methods in which their component encapsulants have predominately thermodynamic polymer portions over thermostatic polymer portions so as to endure soldering temperature cycles without degradation. The invention further provides to the IC assembly with a carrier a mass that contains within it a thermal well sufficient to incorporate the heat flux generated during solder heat exposure, and a resin structure in which the thermal wells function by incorporating the heat flux by randomizing polymer chains rather than in the form of internal energy, in which there is sufficient mass capacity and in which the thermal wells functions to capture the intensity of the heat flux for a period sufficient to allow the encapsulant to withstand bond-breaking and disintegration while, at the same time, reducing stresses sufficient to maintain the integrity of the entire encapsulant assembly during the solder dipping process and during cool-down to room temperature. Additionally the invention provides an attachment of the entire encapsulated IC/carrier assembly to main circuitry to be soldered, e.g. by being passed over wave solder to create the solder contacts with the main circuitry while maintaining a heat-stable, encapsulated and hermetically-sealed integrated circuit structure, so as to form the invention electronic device. The foregoing objects of the invention are thus met.

I claim:

1. A method for the manufacture of an electronic device including putting a circuit board contact and a lead of an integrated circuit chip having a predetermined physical geometry which is substantially constant in the presence of hot solder through a hot solder cycle for electrical connection to each other, and during the course of such hot solder cycle maintaining about said chip in heating contact with said solder a protective composition adhered to said chip, said protective composition comprising a resin subject to expansion with the heat of said solder, said resin having thermostatic crystalline polymer chain portions and thermodynamic amorphous polymer chain portions, the proportion of said thermodynamic polymer chain portions to the total of polymer chain portions being sufficient to absorb the expansion of said resin in the presence of solder heat without commensurate expansion of said thermostatic polymer chain portion so as to maintain the adherence to said chip of said protective composition through said hot solder cycle.

2. The method according to claim 1, including selecting a resin formed from a first reactive component formed of an aliphatic diisocyanate prepolymer and an oligomer reacted with an aliphatic diisocyanate and a second reactive component formed of an aromatic or aliphatic diamine and an oligomer, said oligomer comprising a generally straight-chain polymeric moiety having a molecular weight between about 100 and 20,000 daltons and substituted on about every second to fifteenth in-chain carbon atom and effective to produce three-dimensional twisting and winding atactically, syndiotactically or isotactactically in said resin.

3. The method according to claim 2, including also selecting said first reactive component prepolymer aliphatic diisocyanate from methylene dicylcohexane diisocyanate, isophorone diisocyanate, and hexamethylene diisocyanate, said prepolymer being comprised of from 3 to 50% by weight of said diisocyanate.

4. The method according to claim 3, including also reacting said prepolymer with an aliphatic diisocyanate comprising methylene dicyclohexane diisocyanate, isophorone diisocyanate, or hexamethylene diisocyanate present in an amount from 5 to 15% by weight of said first reactive component.

5. The method according to claim 2, including also selecting as said amine an aromatic amine.

6. The method according to claim 5, including also selecting as said aromatic amine a primary or secondary aromatic diamine comprising a primary or secondary aromatic diamine having di- or multifunctionality and a molecular weight of less than about 2000 daltons.

7. A method for the manufacture of an electronic device including putting a circuit board contact and a lead of an integrated circuit chip having a predetermined physical geometry which is substantially constant in the presence of hot solder through a hot solder cycle for electrical connection to each other, and during the course of such hot solder cycle maintaining about said chip in heating contact with said solder a protective composition adhered to said chip, said protective composition comprising a resin subject to expansion with the heat of said solder, selecting said resin formed from a first reactive component formed of an aliphatic diisocyanate prepolymer and an oligomer reacted with an aliphatic diisocyanate and a second reactive component formed of an aromatic or aliphatic diamine and an oligomer, said oligomer comprising a generally straight-chain polymeric moiety having a molecular weight between about 100 and 20,000 daltons and substituted on about every second to fifteenth in-chain carbon atom and effective to produce three-dimensional twisting and winding atactically, syndiotactically or isotactactically in said resin, selecting as said aromatic diamine 3,5-diethyl-2,4-toluene diamine, di-(3,5methyl thio)2,4-toluene diamine, methylone-bis-orthochloro aniline, methylenedianiline, methylene-bis-methyl anthranilate, m-phenyl diamine, trimethylene glycol-di-p-amino benzoic ester, or amine capped polyols, said resin having thermostatic crystalline polymer chain portions and thermodynamic amorphous polymer chain portions, the proportion of said thermodynamic polymer chain portions to the total of polymer chain portions being sufficient to absorb the expansion of said resin in the presence of solder heat without commensurate expansion of said thermostatic polymer chain portion so as to maintain the adherence to said chip of said protective composition through said hot solder cycle.

8. The method according to claim 5, including also selecting as said amine a primary or secondary aliphatic amine.

9. The method according to claim 8, including selecting said aliphatic amine from ethylene diamine, piperazine, n-aminoethyl piperazine, diethylene triamine, triethylene tetramine, piperazine cyclics, 1,3-bis(aminoethyl) cyclohexane, 1,4 diaminocycylohexane, m-xylene diamine, homologues thereof, and amino-capped low molecular weight polyols.

10. The method according to claim 8, including also selecting as said aliphatic diamine a diamine having a molecular weight of less than about 2000 daltons, said diamine being present in an amount of less than about 10% by weight of said second reactive component.

11. A method for the manufacture of an electronic device including puffing a circuit board contact and a lead of an integrated circuit chip having a predetermined physical geometry which is substantially constant in the presence of hot solder through a hot solder cycle for electrical connection to each other, and during the course of such hot solder cycle maintaining about said chip in heating contact with said solder a protective composition adhered to said chip, said protective composition comprising a resin subject to expansion with the heat of said solder, said resin having thermostatic crystalline polymer chain portions and thermodynamic amorphous polymer chain portions, the proportion of said thermodynamic polymer chain portions to the total of polymer chain portions being sufficient to absorb the expansion of said resin in the presence of solder heat without commensurate expansion of said thermostatic polymer chain portion so as to maintain the adherence to said chip of said protective composition through said hot solder cycle selecting a resin formed from a first reactive component formed of an aliphatic diisocyanate prepolymer and an oligomer reacted with an aliphatic diisocyanate and a second reactive component formed of an aromatic or aliphatic diamine and an oligomer, said oligomer comprising a generally straight-chain polymeric moiety having a molecular weight between about 100 and 20,000 daltons and substituted on about every second to fifteenth in-chain carbon atom and effective to produce three-dimensional twisting and winding atactically, syndiotactically or isotactically in said resin, and selecting as said oligomer active-hydrogen-functional polymerized linear, cyclic or branched alkanes and alkenes, and alkanes or alkenes polymerized with alkenes or alkanes respectively or alkynes.

12. The method according to claim 11, including also selecting as said oligomer homo-and co-polymers of ethylene, propylene, butylene, vinyl, allyl, chlorinated vinyl, diene monomers, oligomers and polymers.

13. The method according to claim 11, including also selecting as said oligomer polyvinyl chloride, ethylene polymers, propylene polymers, dienes, ethylene-propylene polymers, polyisoprenes, natural rubbers, polybutylene polymers, styrenebutadiene polymers, and halogenated polymers.

14. The method according to claim 13, including selecting polymers of 1,3-butadiene as said oligomer, said polymers having a molecular weight of less than about 4000 daltons.

15. The product of the method of claim 1.
16. The product of the method of claim 2.
17. The product of the method of claim 4.
18. The product of the method of claim 6.
19. The product of the method of claim 11.
20. The product of the method of claim 14.

21. An electronic device comprising a circuit board having a contact and an integrated circuit chip of a given physical geometry, said chip having a lead electrically connected in hot-soldered relation to said contact, said chip having a protective composition adhering thereto, said composition comprising a resin having thermostatic crystalline polymer chain portions and thermodynamic amorphous polymer chain portions, said thermodynamic amorphous polymer chain portions being present in such relative proportions that said thermostatic polymer chain portions remain adherent to said chip in their locus of original application after solder heat contact.

22. An electronic device comprising a circuit board having a contact and an integrated circuit chip of a given physical geometry, said chip having a lead electrically connected in hot-soldered relation to said contact, said chip having a protective composition adhering thereto, said composition comprising a resin having thermostatic crystalline polymer chain portions and thermodynamic amorphous polymer chain portions, said thermodynamic amorphous polymer chain portions being present in such relative proportions that said thermostatic polymer chain portions remain adherent to said chip in their locus of original application after solder heat contact, said resin being the polymerization product of a first reactive component formed of an aliphatic diisocyanate prepolymer and an oligomer reacted with an aliphatic diisocyanate and a second reactive component formed of an aliphatic or aromatic diamine and an oligomer, said oligomer comprising a generally straight-chain polymeric moiety having a molecular weight between about 100 and 20,000 daltons and substituted on about every second to fifteenth in-chain carbon atom and effective to produce three-dimensional twisting and winding atactically, syndiotactically or isotactically in said resin.

23. The electronic device according to claim 22, in which said first reactive component prepolymer aliphatic diisocyanate comprises methylene dicyclohexane diisocyanate, isophorone diisocyanate, and hexamethylene diisocyanate, said prepolymer being comprised of from 3 to 50% by weight of said diisocyanate, said prepolymer being reacted with methylene dicyclohexane diisocyanate, isophorone diisocyanate, or hexamethylene diisocyanate present in an amount from 5 to 50% by weight of said first reactive component.

24. The electronic device according to claim 23, in which said amine comprises a primary or secondary aliphatic or aromatic diamine.

25. The electronic device according to claim 24, in which said oligomer comprises active hydrogen functional polymerized linear, cyclic or branched alkanes and alkenes, and alkanes or alkenes polymerized with alkenes or alkanes respectively or alkynes.

26. The electronic device according to claim 25, in which said oligomer comprises homo-and co-polymers of ethylene, propylene, butylene, vinyl, allyl, chlorinated vinyl, or diene monomers, oligomers and polymers.

27. The electronic device according to claim 26, in which said oligomer comprises polyvinyl chloride, ethylene polymers, propylene polymers, dienes, ethylene-propylene polymers, polyisoprenes, natural rubbers, polybutylene polymers, styrenebutadiene polymers, or halogenated polymers.

28. The electronic device according to claim 27, in which said oligomer comprises polymers of 1,3-butadiene as said oligomer, said polymers having a molecular weight of less than about 4000 daltons.

29. A method for the manufacture of an electronic device including putting through a hot solder cycle for electrical connection to each other a circuit board contact and a lead of an integrated circuit chip having a predetermined physical geometry which is substantially constant in the presence of said hot solder, and during the course of such hot solder cycle maintaining about said chip in heating contact with said solder a protective composition comprising an isocyanate containing resin and adhered to said chip, said protective composition being subject to expansion with the heat of said solder, said composition having thermostatic crystalline polymer chain portions and thermodynamic amorphous polymer chain portions, the proportion of said thermodynamic polymer chain portions to the total of polymer chain portions being sufficient to absorb the expansion of said composition in the presence of solder heat without commensurate expansion of said thermostatic polymer chain portion so as to maintain adherence to said chip of said protective composition resin through said hot solder cycle.

* * * * *